United States Patent [19]
Diaz et al.

[11] Patent Number: 5,739,463
[45] Date of Patent: Apr. 14, 1998

[54] SEALED ELECTRONIC PACKAGING FOR ENVIRONMENTAL PROTECTION OF ACTIVE ELECTRONICS

[75] Inventors: Steve Diaz; Dave Horsma, both of Palo Alto; Narendra Kulkarni, Sunnyvale; Peter Lundquist, San Mateo; Akira Nakazato, Santa Clara; Nelson Shen, Palo Alto, all of Calif.; Paul von der Lippe, Loveland, Colo.

[73] Assignee: Raychem Corporation, Menlo Park, Calif.

[21] Appl. No.: 397,600

[22] Filed: Mar. 2, 1995

Related U.S. Application Data

[63] Continuation-in-part of Ser. No. 226,149, Apr. 11, 1994, abandoned.

[51] Int. Cl.⁶ .................................................. H05K 9/00
[52] U.S. Cl. ........................ 174/35 R; 174/35 MS; 361/818
[58] Field of Search .................. 174/35 R, 356 C, 174/35 MS; 361/816, 818; 428/242, 263, 285, 920, 175; 439/607–610

[56] References Cited

U.S. PATENT DOCUMENTS

| | | | |
|---|---|---|---|
| 3,909,504 | 9/1975 | Browne | 174/52 PE |
| 4,041,548 | 8/1977 | Salisbury et al. | 361/396 |
| 4,557,379 | 12/1985 | Lane et al. | 206/328 |
| 4,572,846 | 2/1986 | Foss et al. | 427/237 |
| 4,631,214 | 12/1986 | Hasegawa | 428/68 |
| 4,637,943 | 1/1987 | Bennett | 428/35 |
| 4,695,926 | 9/1987 | McDermott | 361/736 |
| 4,750,957 | 6/1988 | Gustafson | 156/92 |
| 4,774,148 | 9/1988 | Goto | 428/607 |
| 4,852,646 | 8/1989 | Dittmer et al. | 165/185 |
| 4,858,075 | 8/1989 | Butterworth | 361/739 |
| 4,865,905 | 9/1989 | Uken | 428/220 |
| 4,909,745 | 3/1990 | Hayashi | 439/76 |
| 4,912,103 | 3/1990 | Sibbach et al. | 428/215 |
| 4,965,408 | 10/1990 | Chapman et al. | 174/35 MS |
| 5,005,106 | 4/1991 | Kiku | 361/424 |
| 5,031,076 | 7/1991 | Kiku | 361/424 |
| 5,111,497 | 5/1992 | Bliven et al. | 379/27 |
| 5,136,119 | 8/1992 | Leyland | 174/35 R |
| 5,170,009 | 12/1992 | Kadokura | 174/35 R |
| 5,226,210 | 7/1993 | Koskenmaki et al. | 29/527.5 |
| 5,246,383 | 9/1993 | Shimirak et al. | 439/521 |
| 5,285,619 | 2/1994 | Jones | 53/431 |
| 5,319,522 | 6/1994 | Mehta | 361/748 |
| 5,376,019 | 12/1994 | Shimirak et al. | 439/521 |
| 5,378,879 | 1/1995 | Monovoukas | 219/634 |
| 5,394,304 | 2/1995 | Jones | 361/765 |
| 5,436,803 | 7/1995 | Annis et al. | 361/818 |

FOREIGN PATENT DOCUMENTS

| | | | |
|---|---|---|---|
| 0 512 579 A1 | 11/1992 | European Pat. Off. | B65D 81/26 |
| 42 17 837 A1 | 12/1992 | Germany . | |
| 42 29 727 A1 | 3/1994 | Germany | H05K 7/14 |
| 54-156023 | 12/1979 | Japan | C03C 27/06 |
| 4-170080 | 6/1992 | Japan | H05K 1/05 |
| 4-206658 | 7/1992 | Japan | H01L 25/00 |
| 4206658 | 7/1992 | Japan | H01L 23/12 |
| WO 90/13901 | 11/1990 | WIPO . | |
| WO 91/01600 | 2/1991 | WIPO | H04J 3/04 |
| WO 92/03902 | 3/1992 | WIPO | H05K 3/28 |
| WO 92/05603 | 4/1992 | WIPO | H01R 4/60 |
| WO 92/19034 | 10/1992 | WIPO | H02G 15/013 |
| WO 93/05635 | 3/1993 | WIPO | H05K 5/06 |

OTHER PUBLICATIONS

PCT Application (MP1488-PCT) Filed Nov. 8, 1994 (Confidential until Jun. 7, 1995).

*Primary Examiner*—Bot L. Ledynh
*Attorney, Agent, or Firm*—Herbert G. Burkard

[57] ABSTRACT

An environmentally sealed electronics assembly. The assembly includes a flexible envelope surrounding the active electronics board. The electronics board is insertable into the envelope and with subsequent sealing provides a reenterable but environmentally sealed active electronics package. Methods of manufacturing the assembly are also described.

12 Claims, 18 Drawing Sheets

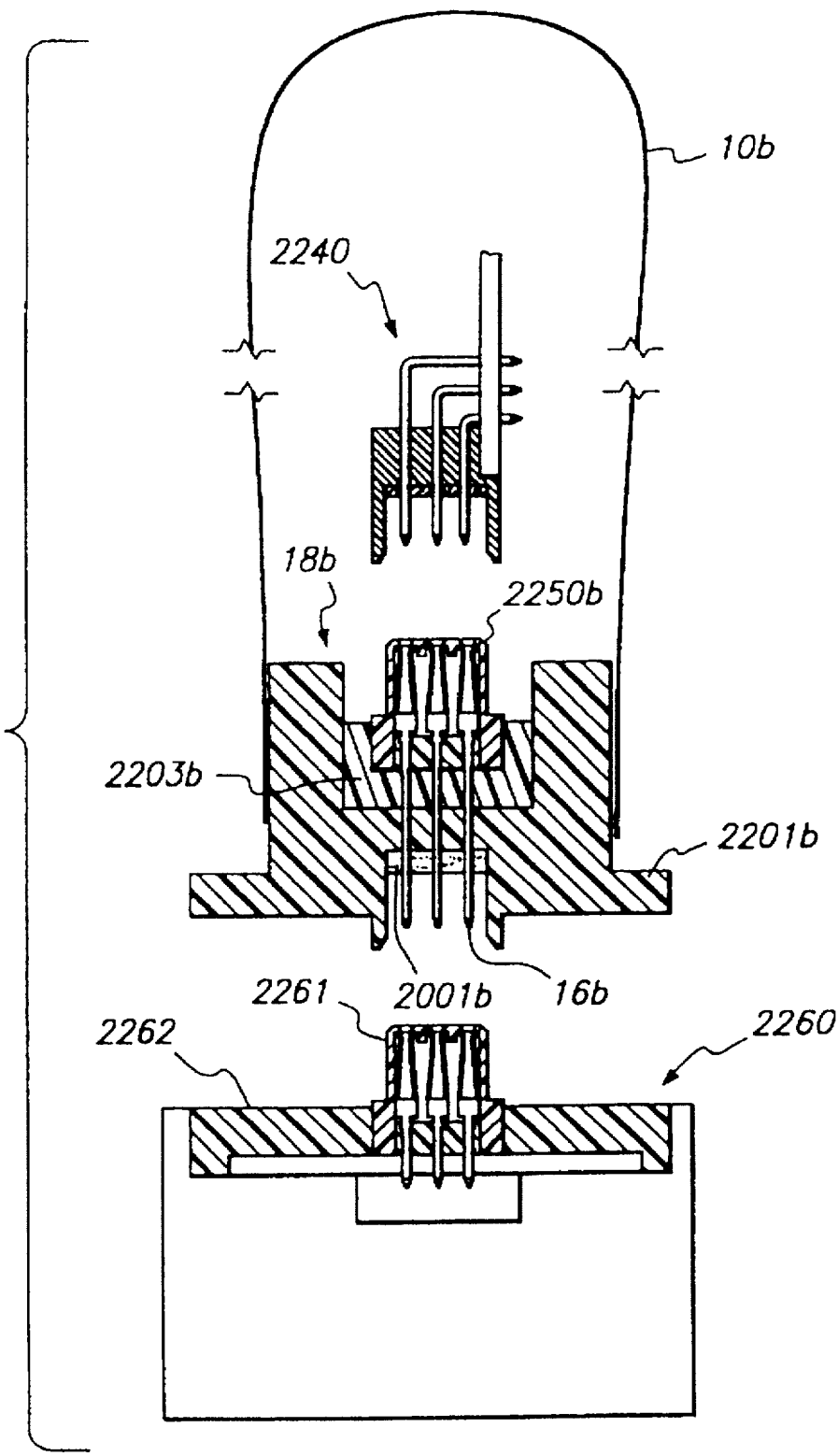

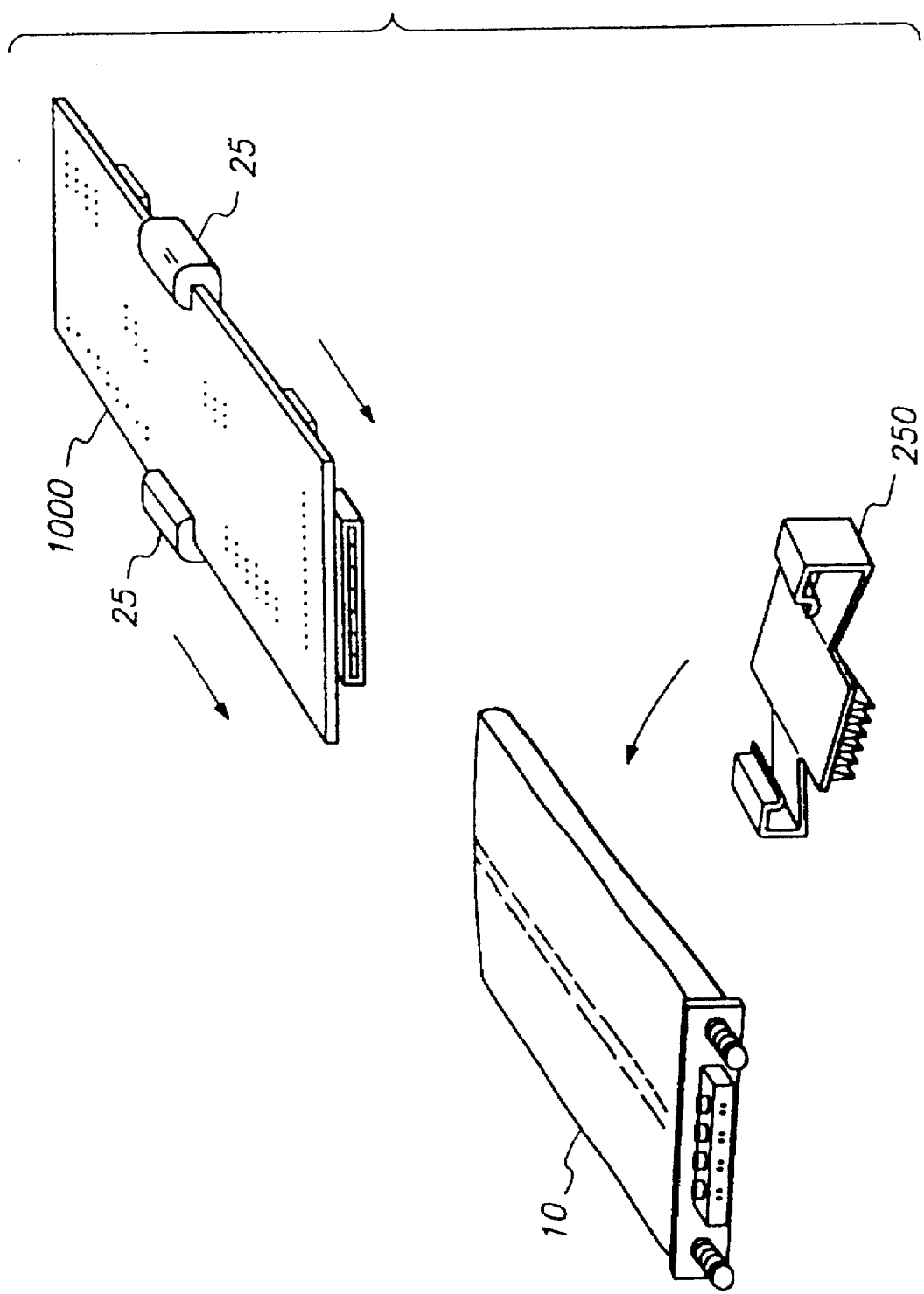

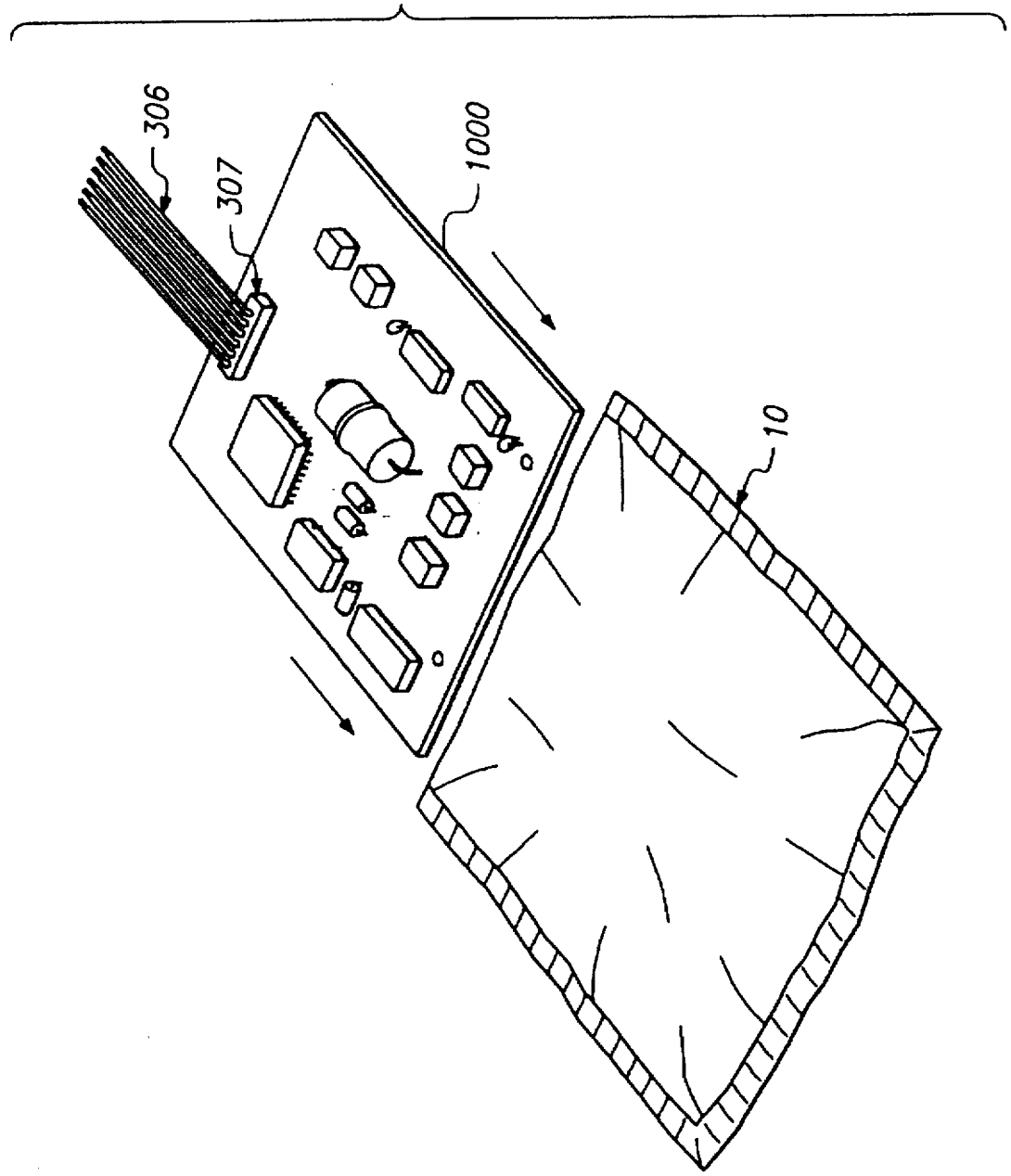

SEALED ELECTRONIC PACKAGING FOR ENVIRONMENTAL PROTECTION OF ACTIVE ELECTRONICS

RELATED APPLICATIONS

This application is a continuation-in-part of application Ser. No. 08/226,149, filed Apr. 11, 1994, now abandoned, the disclosure of which is completely incorporated herein by reference for all purposes.

TECHNICAL FIELD OF THE INVENTION

This invention relates to environmental protection for active electronics. More specifically, this invention relates to sealed electronics packaging for the environmental protection of active electronic circuit boards and the like assemblies. In particular, this invention relates to environmental packaging which permits access to the active electronics boards for repair and reconstruction.

BACKGROUND OF THE INVENTION

Traditionally, most of the electronics in a telephony network has been located in the central office or in a few large electronic installations located remotely from the central office. These remote electronics are powered by power drawn from the power mains and backed up by battery power supplies. The electronics in the central office operate in an environment with a carefully regulated temperature and humidity to assure their proper operation. The remote electronics usually were also installed in vaults with controlled environments, or at least in enclosures that were maintained at a temperature above that of the outdoor environment by the large amount heat dissipated by the system.

Recent advances in digital signal processing has made possible new and more capable transmission systems. Many of these new systems created a need to move the active electronic components in the telephone system away from a temperature controlled central office and out into the general environment where the components will be exposed to wide fluctuations in temperature, humidity and environmental pollutants. To gain the full advantage of these new transmission systems it is desirable to deploy the remote electronics in very small units that are powered from a central point over the transmission media. These power efficient units generate very little heat and so are much more vulnerable to damage from moisture than was the case in the past because they lack the internal heating necessary to keep them dry. As a result there has been an increasing need to environmentally protect these low heat active electronics systems.

The typical small remote electronics unit deployed in the telephone network will be installed by technicians with few tools and limited supervision. The service life of these electronics is expected to be 20 years. Because these units will be relatively expensive, it is also important that they be repairable during production and later when retrieved from the field. These systems will also require a full range of component types to deliver the high performance/cost ratio required by the new network architectures.

Environmentally hardened electronic components exist in the world for military and automotive applications. Military equipment relies on the use of carefully selected and specially packaged components that are then deployed in expensive sealed enclosures. The seals on these enclosures are maintained by the disciplined personnel following strict maintenance procedures and the service life of these systems is relatively short. The materials used are in the most part metals and ceramics which are impermeable to moisture and pollutants. Such hermetic packaging systems are costly for large scale commercial applications. The automotive industry relies heavily on the use of specially selected components that are sealed using polymer potting material. This precludes the ability to repair and return the unit to operation. Since these sealed modules contain relatively small, inexpensive electronic systems that are unlikely to require repair, the use of potting materials has been accepted in this application.

These conventional solutions are insufficient for the new telecommunications systems because they rely on a limited set of components; well supervised maintenance personnel; a hot environment; and the ability to discard defective units rather than to repair them.

Between the factory and use of the active electronics device such as assemblies of microprocessors, dynamic random access memory (DRAMS) and/or other components such as resistors, capacitors, transformers, circuit protection devices, electro-optical devices and the like, the devices are often subject to static electricity and other types of hazards which must be protected against. This is generally been approached through sealing the components in a conductive plastic tube or transparent or semi-transparent plastic or nickel coated plastic type bag. However, there has been a complete lack of recognition that such components, i.e. electronic devices in the active mode when in operation and generating heat can be effectively sealed without overheating in an environmental protection system that will permit a subsequent reentry and access to the circuit board or other electronic devices for repair of discreet components and reuse of the circuit board or other electronic device. This unexpected recognition on behalf of the inventors is a special factor in the present invention.

Sealing multipin electronic connectors by means of a rubber gasket is well known. Connectors sealed in this manner will work where the connection is exposed to occasional splashing with water or in situations where drying heat is available or where the connection is under a frequent maintenance program. But in situations of long term exposure without drying heat, connectors sealed in this manner will become internally wet due to the transmission of water vapor through the insulating polymer materials. This moisture will cause current leakage and corrosion leading to the failure of the connection. The use of a baffled barrier system combined with a selected elastic sealant is uniquely effective in blocking these leakage paths without adversely affecting the mechanical flexing of the contacts or the surface physics of the contact. Surprisingly, this combination effectively prevents current leakage even if the connector has been mated and demated many times.

SUMMARY OF THE INVENTION

The invention pertains to the environmental sealing of active electronics by means of an environmentally protecting flexible packaging material including a moisture barrier therein combined with a sealed connector system which protects the electronics even during the heat generating active operations made without overheating the electronics. The sealing system has no impact on the electronics assembly process and may be removed and replaced many times without damaging the electronics allowing full repair of the electronics. The invention also provides for a method of making a sealing subassembly into which the active electronics can be inserted, simplifying the final sealing of the active electronics. The use of plastic materials in the seals and packaging produces a non-hermetic package; the potential harmful effects of moisture and other harmful chemicals which can diffuse through the plastic materials can be absorbed by optionally including a small amount of desiccant/absorbent inside the package. Thus, the invention provides for the previously desired features as well as many other benefits obvious to an ordinary skilled artisan upon a reading of the preferred embodiments.

BRIEF DESCRIPTION OF THE DRAWING(S)

FIGS. 5a and 5b illustrate cross sections of a sealed pin and socket connector adapter embodiment which is based on a conventional wire wrap DIN connector.

FIG. 12 illustrates an embodiment for extracting large amounts of heat through the bag.

FIGS. 14a and 14b illustrate a sealed active electronics module embodiment where a sealed cable is used for interconnection rather than a sealed multipin connector.

Figure 16:
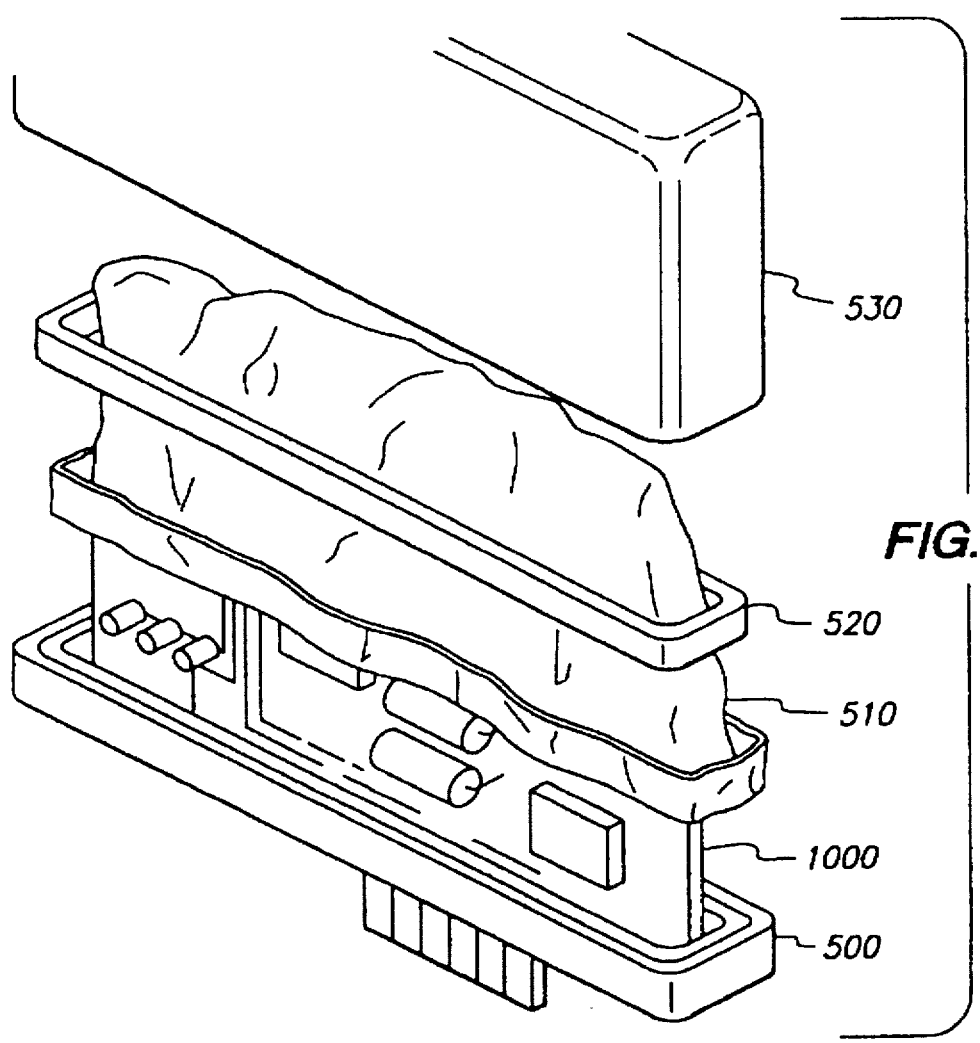
Figure 16A:
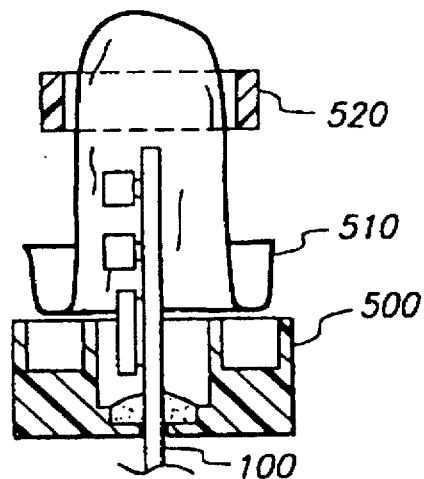
Figure 16B:
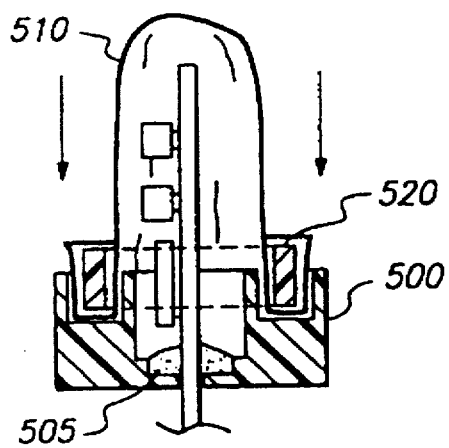

FIGS. 16, 16a, and 16b illustrate an alternative embodiment for inserting the electronics packaging in the environmentally protecting bag using a card edge type connector.

Figure 17:
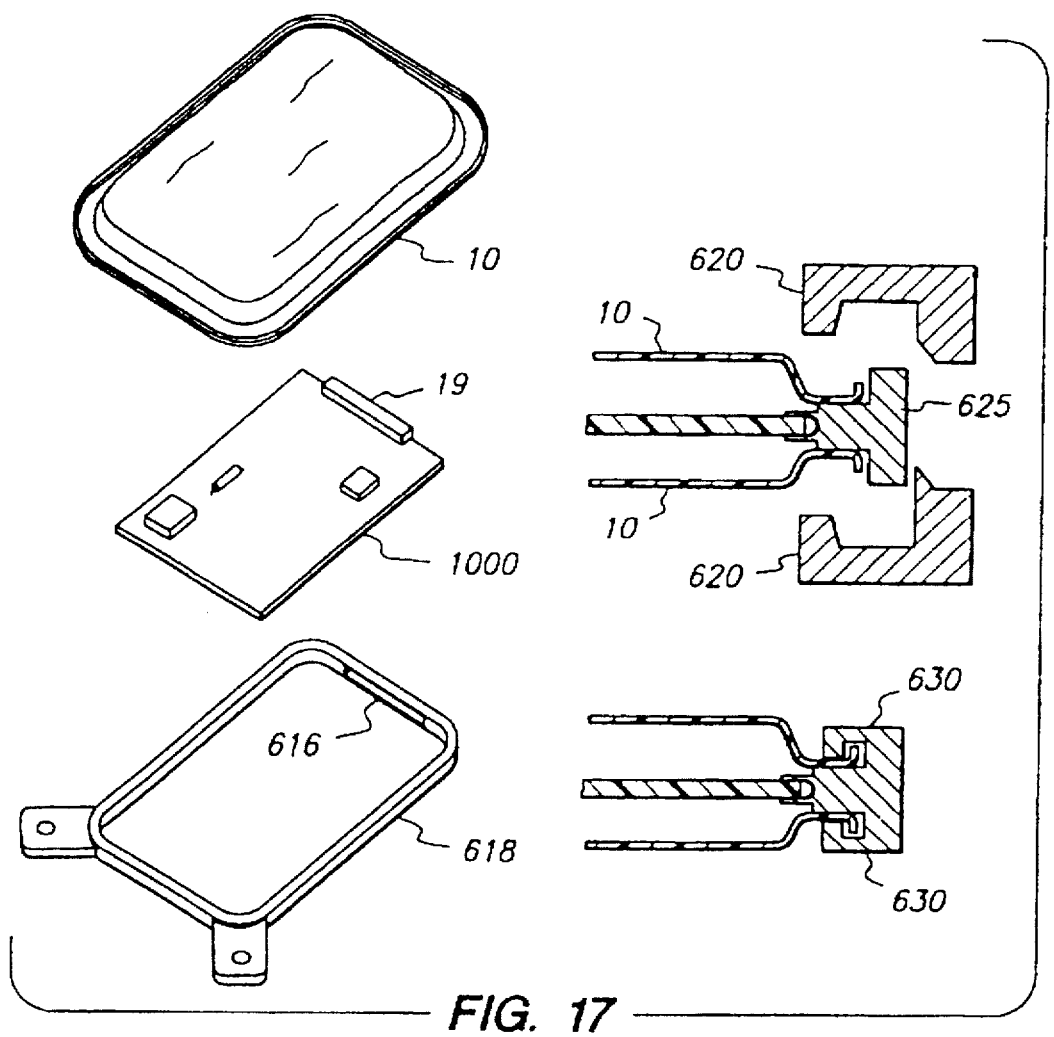

FIG. 17 illustrates another alternative embodiment using a ring type adapter and a two piece sheet closure.

Figure 18:
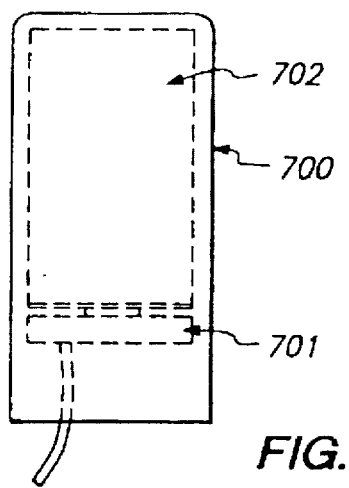

FIG. 18 illustrates an improved packaging system for use in underground applications or when the electronics will be possibly submerged under water for long periods of time.

DESCRIPTION OF THE PREFERRED EMBODIMENTS

Figure 1:
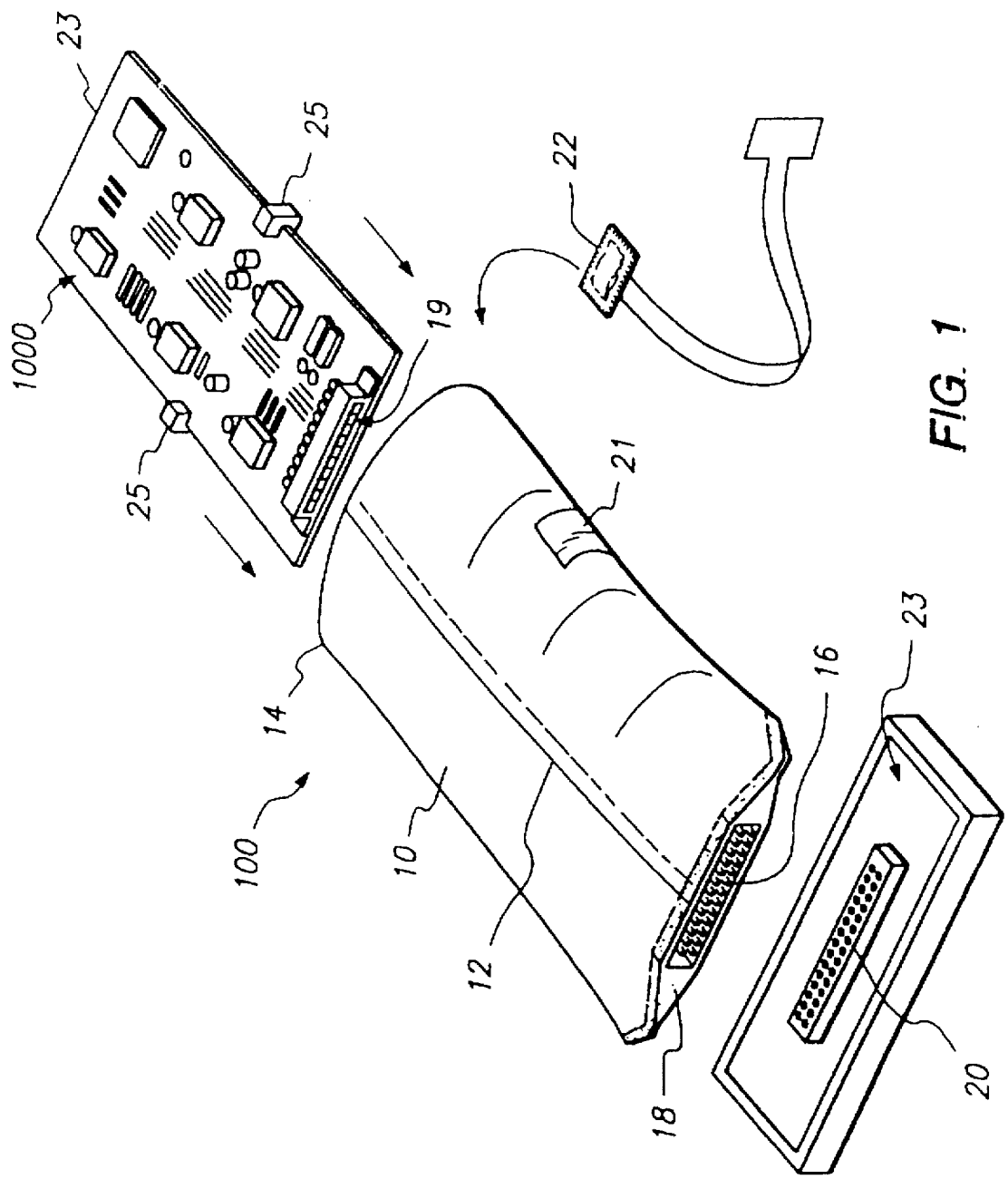
FIG. 1 illustrates an environmentally sealed bag with a sealed pin and socket multipin connector in which the active electronics can be inserted and subsequently sealed.

The particularly preferred embodiments of the invention will be more clearly illustrated by referring to the appended drawings. More specifically, FIG. 1 illustrates the sealed electronics packaging 100 of a shape capable of accepting a complete active electronics board 1000. Of course, the sealed electronic packaging can have any suitable shape capable of accepting the desired shaped electronics board. The packaging can be made of separate sheets bonded together or a single sheet folded over as illustrated. More specifically, the sealed electronics packaging 100 includes a sheet 10 of an environmentally protecting moisture insensitive material formed into a tube that is sized to accept an active electronics board 1000.

The tube can be made with either a lap or fin seal. The sheet material 10 is sealed either with an adhesive or fused along a longitudinal seam 12 and around an adapter module 18 with pin contacts 16 passing through the adapter and protruding on the inside and outside of the adapter module.

A gas tight seal is constructed around of the pin contacts 16 as they pass through the adapter 18 in a manner described below. The pin contacts 16 protruding on the inside of packaging 100 are capable of mating with the connector 19 on the electronics board 23 and the pin contacts 16 protruding on the outside of the packaging 100 are capable of mating with a sealed connector 20 which carries the signals from the active electronics 1000 to the rest of the system. Stabilizer blocks 25 are attached to the active electronics 1000 to prevent damage to the electronics. This feature will be described in greater detail below. The active electronics 1000 are inserted into the open end of the illustrated packaging 100 until the connector 19 plugs into the connector pins 16 protruding on the inside of packaging 100. In some cases the active electronics 1000 will have sharp points extending a short distance from it's surfaces. These sharp points could puncture the sheet material 10 and cause a leak. This sharp point problem can be effectively addressed by first surrounding the active electronics 1000 with an extruded plastic mesh tube with large holes, plastic foam, fish paper, or paper containing desiccant materials. These materials are inexpensive, will not affect the heat transfer, and are thick and tough enough to prevent the sharp points from touching the sheet 10. After the connector 19 is engaged a packet of desiccant/scavenger 22 is inserted into the open end of the packaging 100 and the back edge 14 is sealed using a simple heat sealing machine.

Alternatively, this seal could be made using a gel type sealant and a metal clip, velcro, or extruded zipper. These types of seals have the advantage that they can easily be opened and reclosed. Once this seal is complete the active electronics 1000 is protected from the effects of moisture and other pollutants. In some cases it is necessary for the user of the final assembly to view lights that are attached to the edge of the active electronics 1000. A transparent window 21 is provided in the sheet of material 10 through which these lights may be seen. Preferably the window is moisture impervious such as plastic plus ITO coating. Optionally a one way valve can be included into the bag to out-gas excess pressure if the bag were sealed at sea level and then moved to a high altitude application or preferably slack volume can be introduced during final sealing so that with temperature or pressure changes during operations, the volume of the flexible laminate barrier can change without generating internal pressure. A suitable temperature operating rang is from about −40° F. to about 200° F. The pressure will vary from a water head of about 20 feet to an effective altitude of about 20,000 feet.

Figure 2:
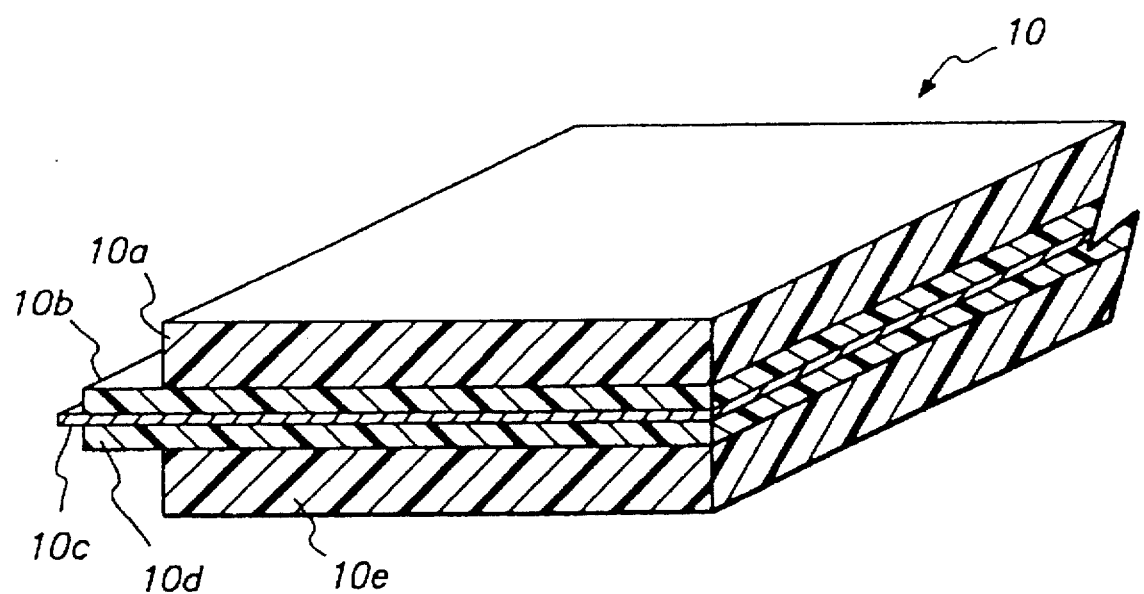
FIG. 2 illustrates a cross section of an embodiment of a sealed electronics packaging laminate construction.

The layers of material 10 and particularly the preferred embodiments are described in FIG. 2, and generally must resist the ingress of moisture resist puncture by any sharp protrusion and maintain its integrity for the life of the product. Any laminate or substrate material capable of resisting puncture, withstanding chemical environments, and temperature extremes while maintaining a high level of protection against moisture ingress and other environmental hazards and the like is suitable for use in this invention. Particularly, materials which are known to be stable and consistent over time in these environments are suitable.

A preferred laminate construction would be of sufficient thickness to be handled without puncture, tear or loss of seal integrity. Ranges for the layer thickness are up to 12 mils for the outside layers, 4 mils for the inside layers, and 1 mil for the middle layer. A particular sheet material 10 comprises top and bottom layers of a suitable material such as high density polyethylene about 6 mils thick and interior layers of ionomer about 2 mils thick and a center layer 1 mil of a metal such as aluminum or other suitable material. Interlaminar bond strength should remain above 2 lbs./inch as per ASTM D 1876-93. Optionally the interior surface of the material may be made black to absorb heat radiated by the active electronics during operation. Additionally the exterior and or the interior surfaces may be made with an antistatic coating to reduce electro-static-discharge ESD potential. In certain environments the envelope is an inner and an outer layer of plastic with a central metal layer. Suitable thicknesses are 15 mls., 1 mls. and 15 mls., respectively.

The general performance of the sheet material must pass the following specifications: the puncture resistance of the material when tested using ASTM F 1306-90 with a screwdriver type tip should be greater than 25 lbs., and with a pin type tip should be greater than 15 lbs. Preferably the screwdriver puncture resistance should be greater than 30 lbs and pin resistance 20 lbs. The material should have a tear resistance of greater than 8 lbs, preferably greater than 12 lbs. when tested according to ASTM D 2582-93. The heat seal obtained at the seams of the laminate when formed into a pouch should resist separation by a force of greater than 30 lbs. most preferably greater than 35 lbs. when tested to ASTM D 1876-93. These performance characteristics should not degrade significantly with time or environmental exposure.

A suitable laminate is illustrated in PCT application WO 92/19034, (U.S. application Ser. No. 08/129,201, filed Oct. 13, 1993) completely incorporated herein by reference for all purposes but any laminate layer capable of resisting puncturing while providing inhibition to moisture ingress and protection from environmental hazards such as pollution and the like is suitable for use in the invention. FIG. 2 illustrates a preferred laminate construction. Ranges for the layers can be between about 75 and 350 microns for layers 10a and 10e between about 20 to 200 microns for layers 10b and 10d, and between about 5 to 75 microns for layer 10c. The particular sheet material 10 comprises top and bottom layers 10a and 10e of a suitable material such as low density polyethylene about 200 microns (8 mls thick) and two interior layers about 80 microns (3 mls thick) of cast polyamide or polyester and a central layer of about 20 microns (1 ml thick) of aluminum or other suitable material. Optionally but not illustrated, the interior of surface of the material may include a black paint or other material to absorb heat radiated by the active electronics during operation. By interior it is meant that portion of the sheet which upon welding into an envelope or an enclosure will have the black sides facing each other on opposite sides of the electronics board.

In some cases it is desirable that the laminate have a three dimensional shape rather than be flat. This can be achieved by forming the sheet before welding. If a large volume enclosure is required, the aluminum layer could be replaced with a highly plastic metal such as commonly found in tin, tin alloys, and the like to sustain large deformations. The material used to make window 21 must also, as much as possible, block the transmission of moisture, chemical pollutants, and electronic noise while remaining transparent. This can be accomplished by using transparent plastics coated with thin coatings of inorganic materials such as indium tin oxide (ITO), $SiO_2$, doped $TiO_2$, doped $AL_2O_3$, and the like. For example a multilayer laminate made of polyester and low density polyethylene can be used with or without the inorganic coating.

The sheet material 10 can be fused to the adapter 18 if the inner layer of the flexible laminate and the adapter are made out of similar polymer materials. Fusion is the preferred approach. For example, making the adapter out or polyethylene or a suitable thermoplastic material common to both packaging and injection molding, and making the inner layer of the sheet material also of the same material, by applying sufficient heat to the area the materials will fuse together. Additionally, having the outer layer of the material match the adapter material would allow the outer layer to flow and bond with the adapter material, covering the raw edge of the sheet material.

Alternatively the edges can be adhesively sealed to form the closure. In a preferred embodiment, the sheet material 10 is sealed to the adapter 18 by means of a hot melt adhesive or a reactive hot melt adhesive. Specifically a styrene-butadiene-styrene, SBS polyamide or polyester based hot melt adhesive or thermosetting epoxy, polyurethane or polyester could be used. It is important that high frequency noise be blocked from passing through the packaging 100 by enclosing the active electronics 1000 in a conductive layer. The foil layer in the sheet material 10 may be effective for this purpose, and a conductive layer can be deposited on the inner surfaces of the adapter 18 by a variety of processes such as vapor deposition, plating, or painting with conductive paint. Care must be taken to avoid shorting out the connector pins 16. To connect the foil layer in the sheet material 10 to the conductive layer on the inner surface of the adapter 18, an electrically conductive hot melt adhesive may be used.

Electrically conductive hot melts can be formulated by the addition of conductive fillers to standard hot melt adhesives. Descriptions of such materials and also alternatively ferromagnetic fillers could be used so that an alternating magnetic field will provide the heating during assembly. Raychem's U.S. patent application Ser. No. 08/049,900 describes such materials. The application is completely incorporated herein by reference for all purposes.

Even with these measures, a small amount of moisture (about 30 micrograms/hour) and pollutants such as $H_2S$, $SO_2$, $Cl_2$, and $NO_2$ will be transmitted through the polymer seals of packaging 100 and damage the active electronics 1000. A desiccant/scavenger packet 22 addresses this transmission issue where it poses a problem. The package absorbs this small quantity of moisture and pollutants over the 20 year life of the system. In the preferred embodiment, silica gel, alumina, and molecular sieves are used to absorb moisture and polluting gases. Naturally, it is important that the desiccant/scavenger packet 22 be maintained in a dry, unreacted state until it is time to seal the packaging 100. Suitable examples are taught in U.S. application Ser. No. 07/973,922 filed Nov. 9, 1992 and completely incorporated herein by reference. It is also important that the packet 22 never be accidentally left out of the packaging 100 during final assembly. The packet 22 is anchored inside the packaging 100 such that the clear view through the window 21 is retained.

In the preferred embodiment, the desiccant/scavenger material is sealed in a polyethylene bag with a moisture vapor transmission rate sufficiently high to keep the relative humidity low inside the sealed electronic package but low enough to protect the desiccant from the humidity before the electronic package is sealed. Alternatively, the desiccant/scavenger material is sealed in an impermeable package that has a hole punched on one side. This hole is sealed by an adhesive patch attached to a long colored ribbon. Using a pressure sensitive adhesive, the pack is attached in a convenient location inside the packaging 100 with the ribbon passing out of the open end and with its free end attached to the outside of the packaging 100. Before the final sealing of the back edge 14 can be done the assembler must pull out the ribbon thus exposing the desiccant/scavenger at the last moment before the final seal is made. After this final seal is made, the seal integrity can be tested by heating the sealed electronics packaging 100 in an oven for a few minutes or hours. The heat will cause the air in the packaging 100 to expand and leak out or visibly expand the package envelope of a properly sealed unit. When the units are returned to room temperature the leaking ones will collapse and be readily detected. Alternatively, before the final seal is made, a pressure test can be performed by inserting a rubber stopper into the open end of the package with air pressure connected through the stopper and lowering the system into water. By pressurizing the package under water any leakage will be visible as air bubbles. A further alternative test is a vacuum or a squeeze test which can be used for the same purpose.

Figure 3:
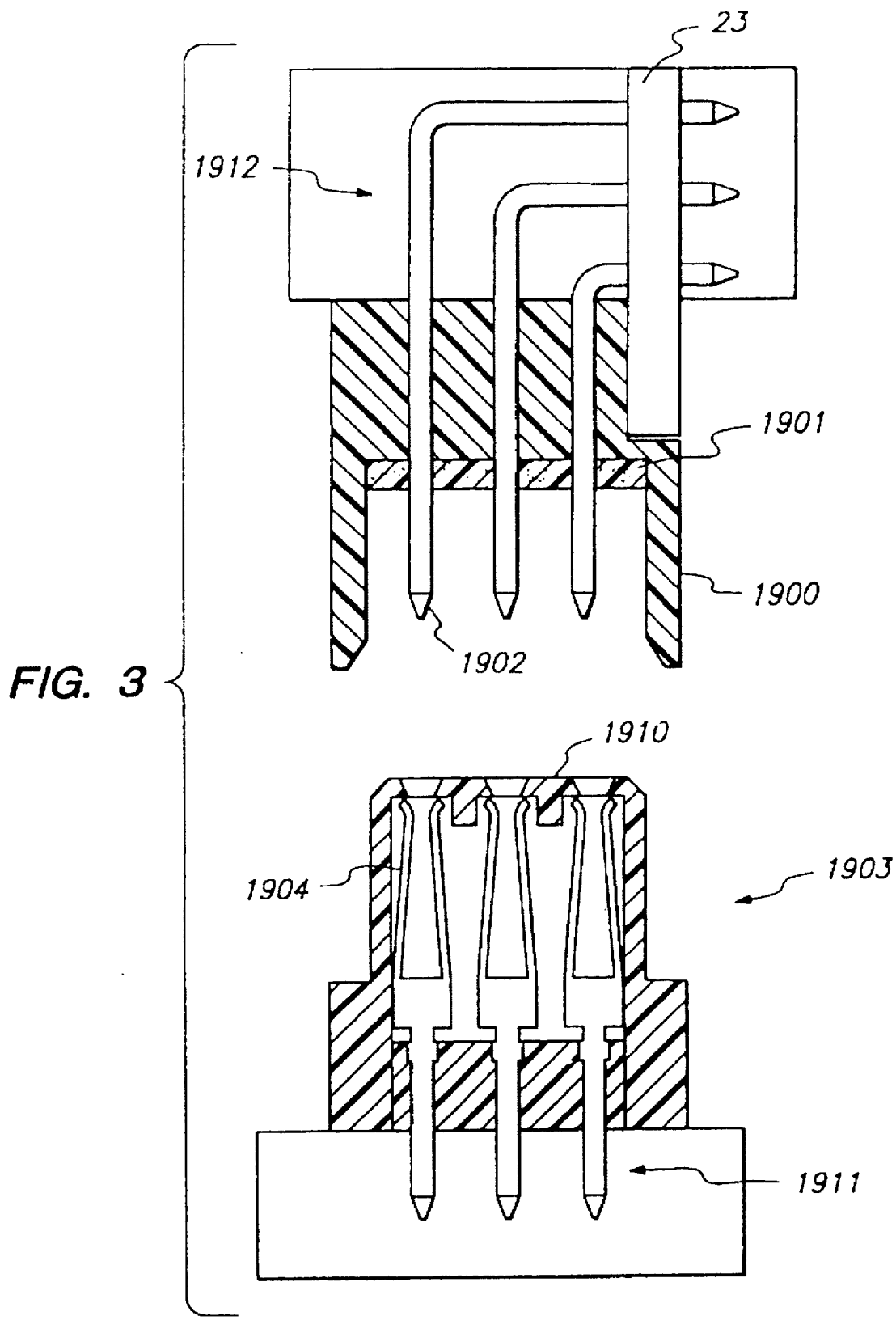
FIG. 3 illustrates a cross section of a pin and socket connector with a conventional sealing gasket.

The effective sealing of the active electronics 1000 also requires sealing the pin connectors 16 when engaged with the connector 20 to provide an overall sealed system. FIG. 3 illustrates the cross-sectional view of a commonly available sealed connector. It consists of a male pin half 1900; a sealing gasket 1901; connector pins 1902; a female half 1903; and connector receptacles 1904. When the male half 1900 is mated with the female half 1903 the sealing gasket 1901 is pressed tightly against the connector housing top 1910 making a seal. In accordance with the present invention, if the connector backsides 1911 and 1912 are sealed by potting material or by the packaging 100, then water cannot leak into the cavity around the connector receptacles 1904. This type of connector design will prevent the formation of conductive paths within the connector for a short period of time, but because moisture and pollutants can transmit through the molded plastic polymer holding the pins, if continuously exposed to high humidity and pollution, the cavity surrounding the receptacles 1904 will eventually become wet and contaminated. This contamination will provide leakage paths between the pin connector receptacles 1904 and corrosion of the pin receptacles 1904 and the pins 1902 will take place, degrading the quality of the connection.

Figure 4:
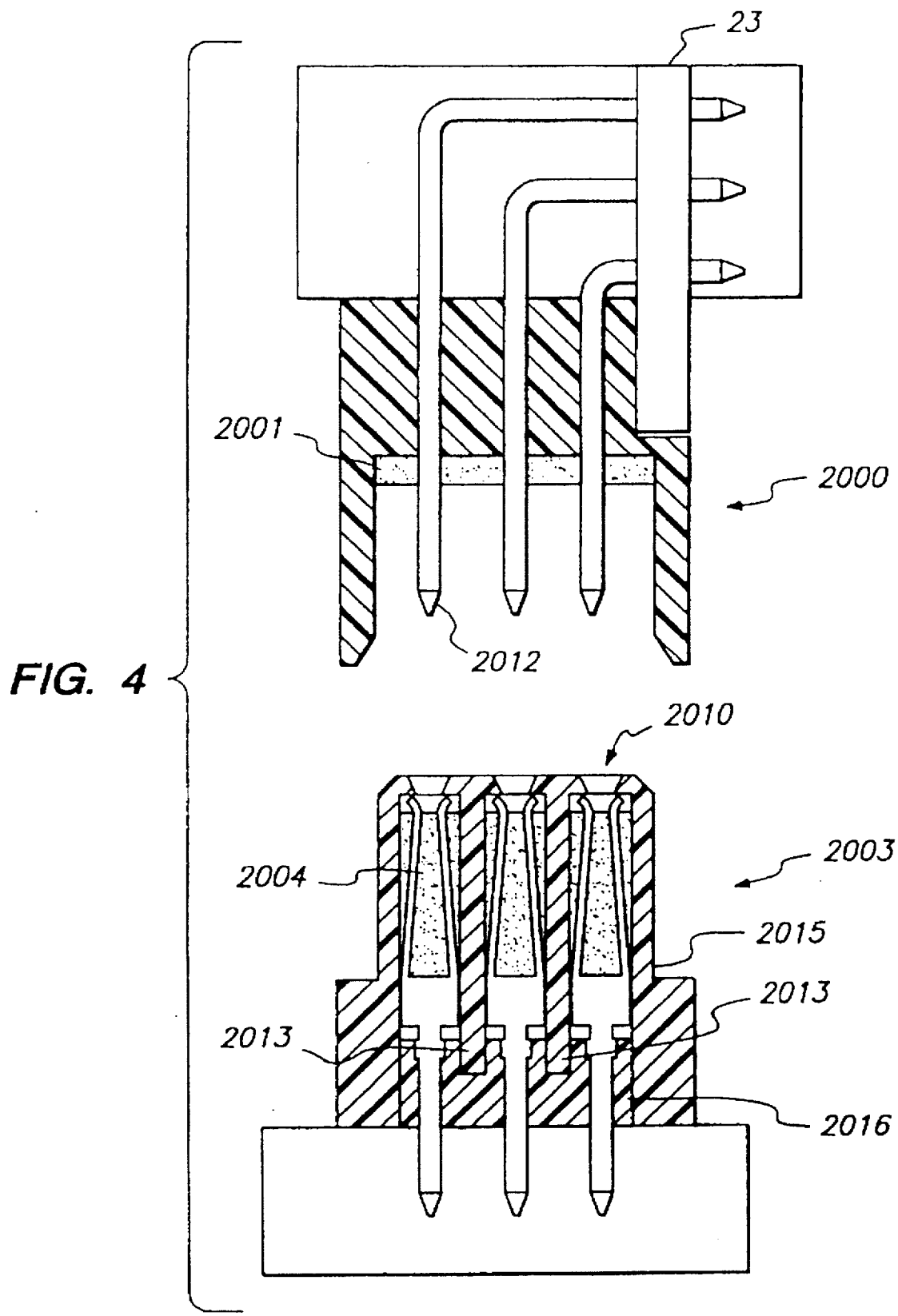
FIG. 4 illustrates a cross section of a pin and socket connector embodiment which is sealed using an elastic sealant combined with a baffled construction.
Figure 4B:
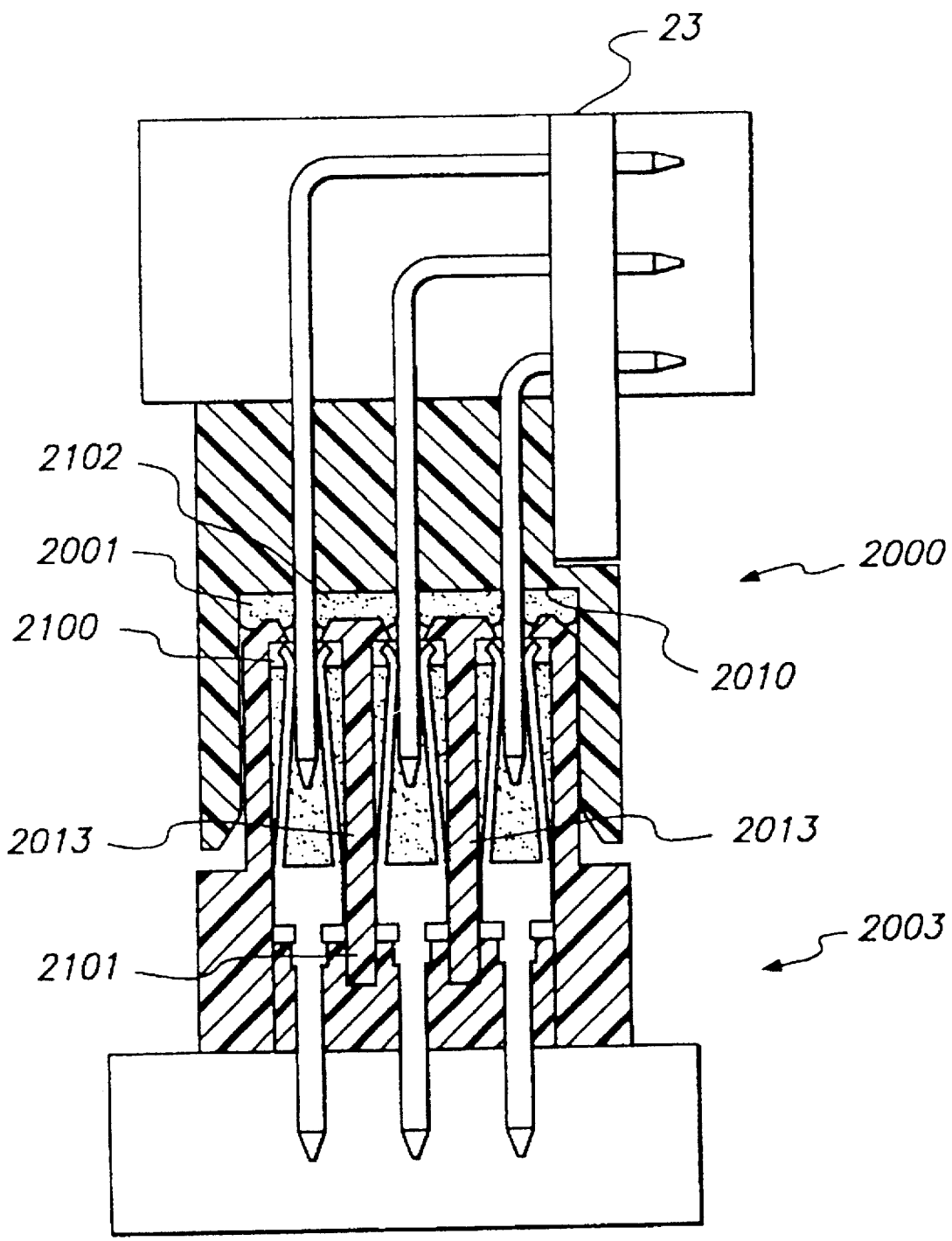
FIG. 4b illustrates a mated cross section of a pin and socket connector in FIG. 4 showing the blocked leakage paths.

FIGS. 4 and 4b a show a partial cross-sectional view of the connector of the preferred embodiment that provides a greatly improved sealed connector. The male half 2000 is identical to the conventional male half 1900 but the construction of the female half 2003 differs from the female half 1903. The female half 2003 is fabricated by inserting the receptacles 2004 into a polymer base plate 2016. Then a polymer upper cover 2015 is installed over the receptacles 2004. The upper cover 2015 is molded with baffles 2013 that surround each receptacle 2004 and extend almost to the base plate 2016. A hydrophobic sealant material such as a grease or preferably an elastic gel is added into the female half 2003 to almost completely fill the cavity in the female half 2003. Silicone gels as described in U.S. Pat. Nos. 5,111,497; 5,246,383; Ser. No. 07/006,917, completely incorporated herein by reference for all purposes, are particularly suitable for this purpose because the gels will adhere to the surfaces inside the connector and yet are sufficiently elastic that the gels will not interfere with the deflection of the receptacle during insertion of the pin contact 2012. These gels are extremely effective at keeping water off of metal and plastic contact surfaces. Preferred gels include the property of being hydrophobic.

Female connectors with baffles for the support of the contacts are commonly available. The DIN connector series (Per DIN 41612, IEC 603-2) manufactured by T&B and other manufactures contain baffles which prevent the accidental contact of the receptacles 2004 and to support small wedges that hold the elastic arms of the receptacles 2004 in a pre stressed state beneficial to making a good contact. These structures are serendipitously useful for the purpose of sealing. An additional surprising benefit of a silicone gel material is that its extremely low surface energy causes it to wet to surfaces aggressively. The large surface area produced by the internal baffles 2013 makes it possible to fill the connector cavity by simply pouring the uncured gel through the small holes in the housing top 2010. The low surface energy allows the liquid to creep through the holes, coat the walls of each interior surface and fill the connector completely.

A viscosity of less than 1000 centipoise, preferably about 800 centipoise, for the uncured gel is sufficiently low to permit filling a connector with a distance between pins of about 0.10 inches. The presence of gel or grease in the female half 2003, particularly at the bottom where the polymer base plate 2016 meets polymer upper cover 2015 and the baffle 2013 will prevent the formation of a moisture and contaminant track between the receptacles 2004. This gel or grease should be sufficiently soft to allow encapsulation of the mating pins in the male half 2000 without excessive force. A hardness in the range of 15–50 grams as measured by a texture analyzer using standard MQC procedures will satisfy these conditions. U.S. Pat. No. 4,852, 636, completely incorporated herein by reference for all purposes, teaches a procedure known to the ordinary artisan for determining gram hardness of a material. This is sometimes referred to as Voland hardness. The gasket 2001 in the male half 2000 could be made of rubber or gel material with a higher elastic modules and hardness. A hardness in the range of 30–70 grams will satisfy the requirement that the gel or rubber in the male half must withstand multiple reentries without damage to the gel sufficient to cause it to lose its sealing capability. A gel with a hardness of 30–50 grams will satisfy the requirements of both the female half 2003 and the male half 2000 and could be used interchangeably in both areas. The gel material has the advantage that it will readily break up moisture tracks on the housing top 2010 because of the hydrophobic properties of the gel material. Thus the connector could be mated with moisture present on the surfaces and a high insulation resistance could be achieved.

The gel type gasket is preferably cured in place to achieve a high adhesion with the male half 2000. In an alternative embodiment, this gel type gasket could be fabricated by punching out an open cell foam reinforced gel sheet as described in detail in U.S. Pat. No. 4,865,905 and U.S. application Ser. No. 07/762,533 filed Jan. 14, 1992, said patent and application are completely incorporated herein by reference for all purposes. These gaskets can be retained in place by molding gripping features into the adapter 18 (FIG. 1) or by means of a mechanical frame that snaps or screws into place.

FIG. 4b illustrates another advantage of this design. With frequent mating and demating cycles the mechanical stress in the gel is high only on the material near the top of the cavity in the female half 2003 so loss of gel and the production of voids 2100 that can become moist tends to be only in this area. These voids, however, are isolated from each other by the gel sealing the lower path 2101 between the receptacles at the bottom of the female half 2003 and by the gel or rubber gasket 2001 pressed on the housing top 2010 that blocks the upper path 2102. In some cases a coaxial connector will be used to interconnect high frequency signals into the active electronics 1000. The same sealing technique can be used with this type of connector where the center female contact is filled with gel to prevent shorting leaks from the center contact to the ground.

Figure 5A:
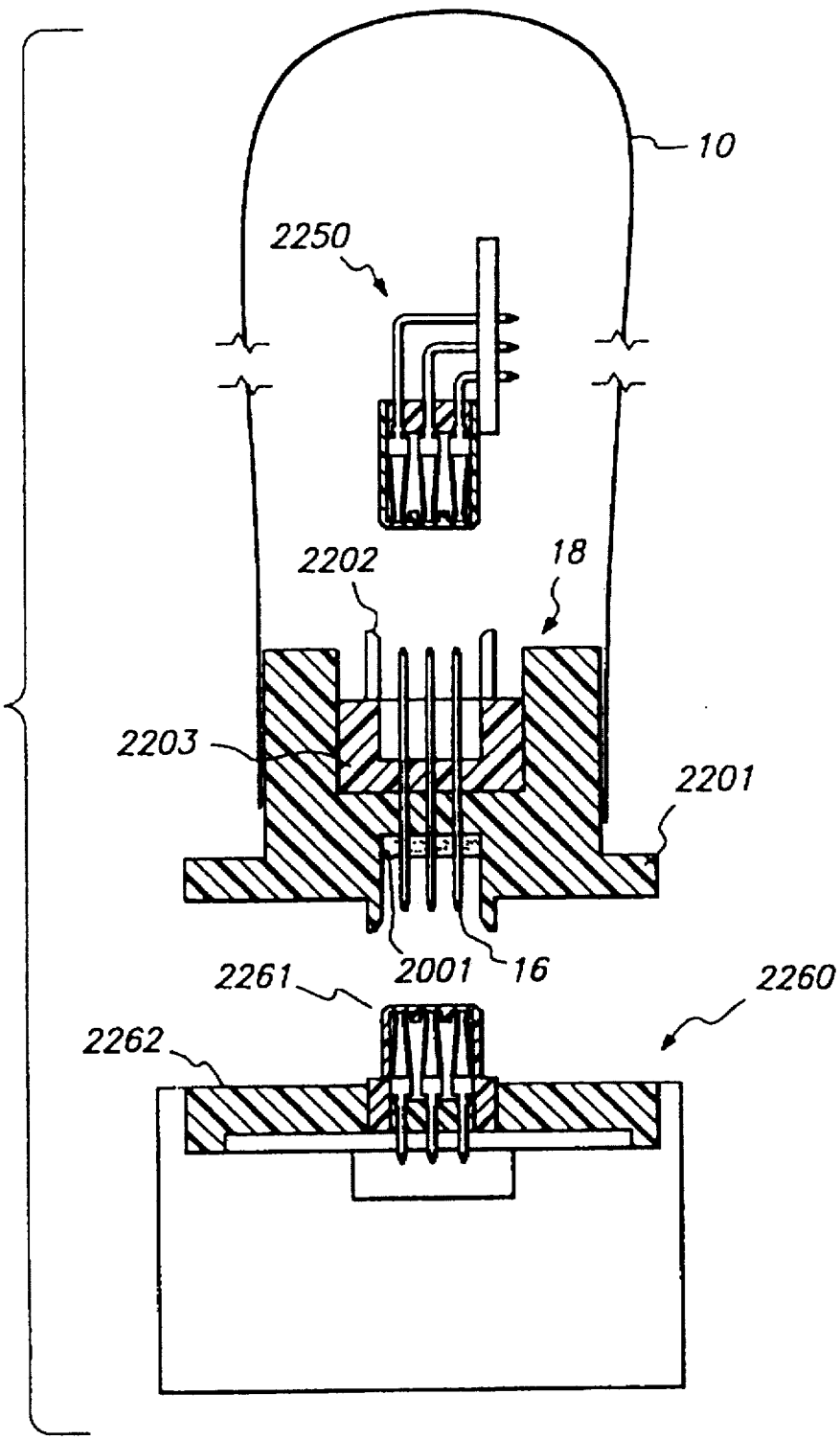

FIGS. 5a and 5b illustrates a cross-sectional view of the adapter 18 or 18b installed in an injection molded part 2201 or 2201b (18 in FIG. 1) and sealed using a potting material 2203 or 2203b such as a 2 part curable polyurethane or epoxy compound. FIG. 5a is the male-female embodiment while FIG. 5b is the female-male embodiment. The main difference is socket 2250 in FIG. 5a and the pin embodiment 2240 in FIG. 5b. Identical parts are labeled the same while alternative embodiments include "b" next to the number in FIG. 5b. Subsequently, the flexible sealing bag 10 is bonded to the molded part. To prevent the leakage of the potting material during the potting process, a close fitting plug can be inserted in place of the gasket 2001 until the potting material cures.

Figure 6:
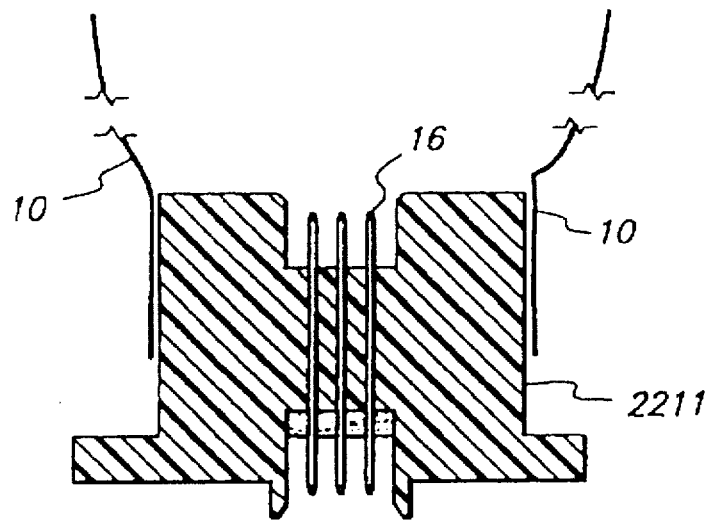
FIG. 6 illustrates a cross section of a sealed pin and socket connector adapter embodiment which is based on a custom connector design.

FIG. 6 illustrates a alternative adapter design where the contact pins 16 are inserted or molded directly into the molded adapter part 2211. As in FIG. 5, the sealing bag 10 is subsequently attached. This embodiment saves the potting step and in essence creates a one part DIN connector interface between the interior of the bag and the outside environment. In FIGS. 5a and 5b but also useful with FIG. 6 embodiments, the backplane board 2260 includes sockets 2261 potted 2262 in the board. The sealed electronics plug into the backplane board 2260.

Figure 7:
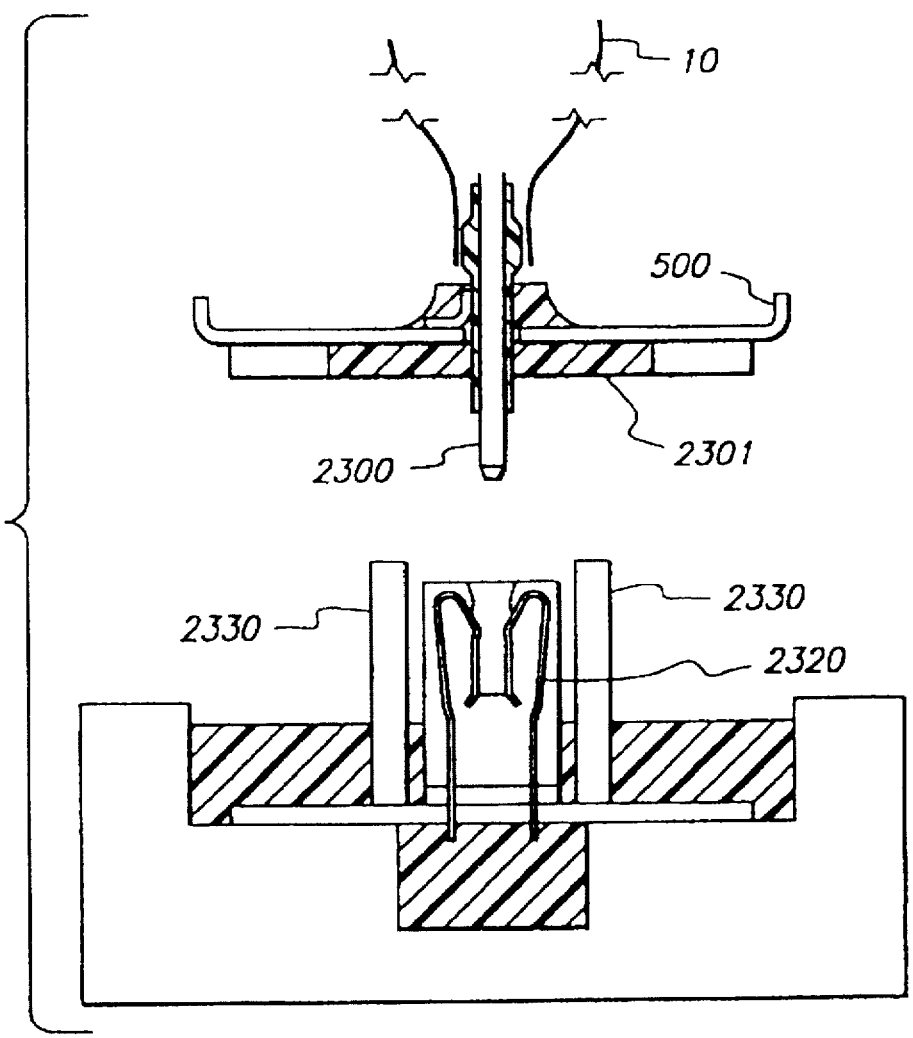
FIG. 7 illustrates a cross section of a sealed card edge connector adapter embodiment which employs a sealing barrier design.

FIG. 7 illustrates the method of sealing a card edge type connector 2300. A sealing gasket 2301 is attached to the adapter 500 so that when the connector is plugged into the female half 2320 the gasket 2301 will be pressed tightly against the lip of the female half 2320 and the sealing ring 2330. To further block the leak paths in the female connector 2320 gel can be deposited into it.

Figure 8:
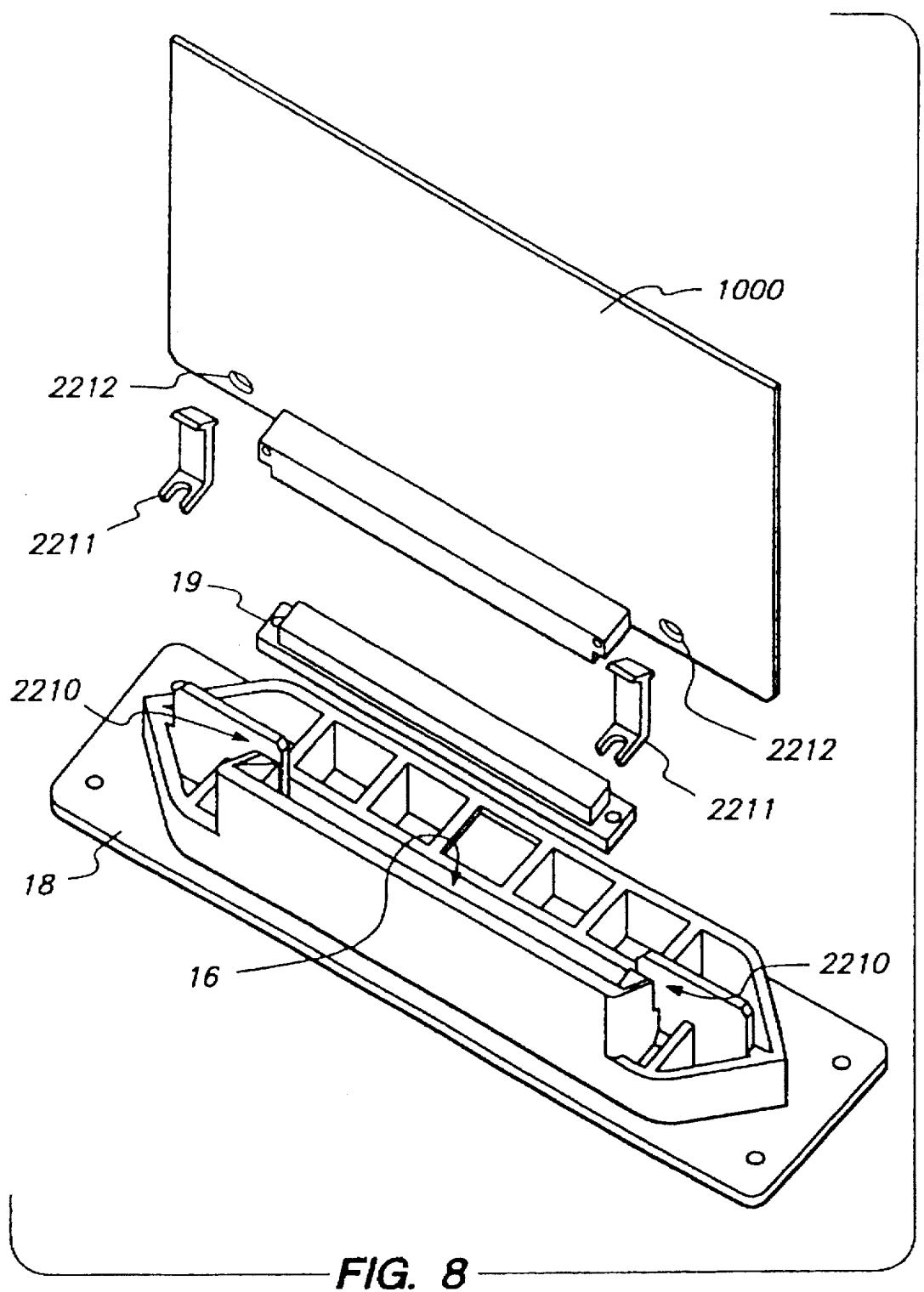
FIG. 8 illustrates a view of a guide and latch system embodiment to attach the electronics board to the adapter without direct access for attachment of the parts.

FIG. 8 illustrates a guide and latch mechanism that permits the active electronics 1000 to be plugged into the connector pins 16 protruding on the inside of the adapter 18. Guiding ribs 2210 are used to safely guide the female connector 19 into engagement with the connector pins 16 protruding on the inside of the adapter 18. A latching hook mechanism 2211 will then fall into a hole 2212 in the active electronics board holding it securely to the adapter 18. Preferably, the latching hook 2211 includes a tactile and positive lock to prevent unwarranted unlocking of the board under vibrating conditions as well as providing a positive sense of when the board is locked in place to the connector.

Figure 9:
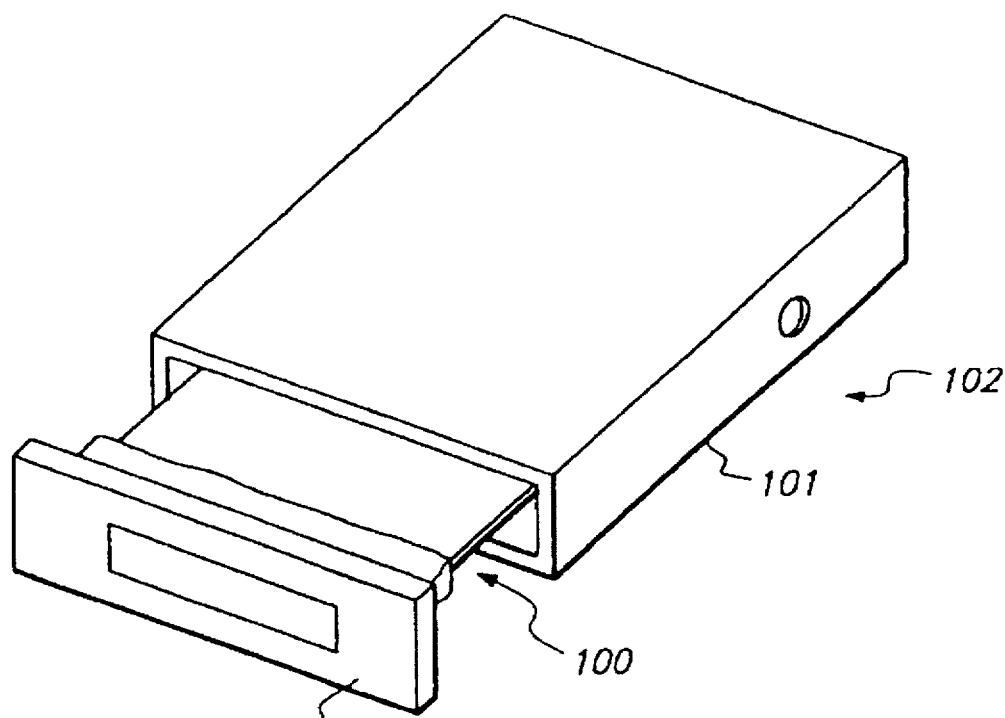
FIG. 9 illustrates an embodiment mechanically protecting the sealed electronics packaging.

If the sheet material 10 is relatively thin and flexible it would be possible to damage the active electronics 1000 (not visible) by pressure on the outside of the packaging 100. FIG. 9 illustrates a method of preventing this problem in situations where the module may receive rough handling. After sealing the package 100 the assembly is inserted into a protective box 101. The adapter 18 could be designed to fit closely to the open end of the protective box 101 with provisions for screws or other fasteners to hold the parts together forming a finished electronic module 102. If screws are used, then the module 102 can easily be opened later to make repairs on the active electronics 1000. To permit the active electronics 1000 to be gripped and stabilized by the protective box 101 spacer blocks 25 (FIG. 1) are attached to the active electronics 1000 before sealing the sheet 10. These blocks, optionally foam blocks, are sized to just fit inside the protective box 101. This will prevent damaging flex of the active electronics and the connector 19 during handling and vibration and also help protect the flexible laminate. In the preferred embodiment, the protective box 101 is blow molded and holes are provided to drain water and to permit the viewing of the lights on the active electronics 1000.

Figure 10:
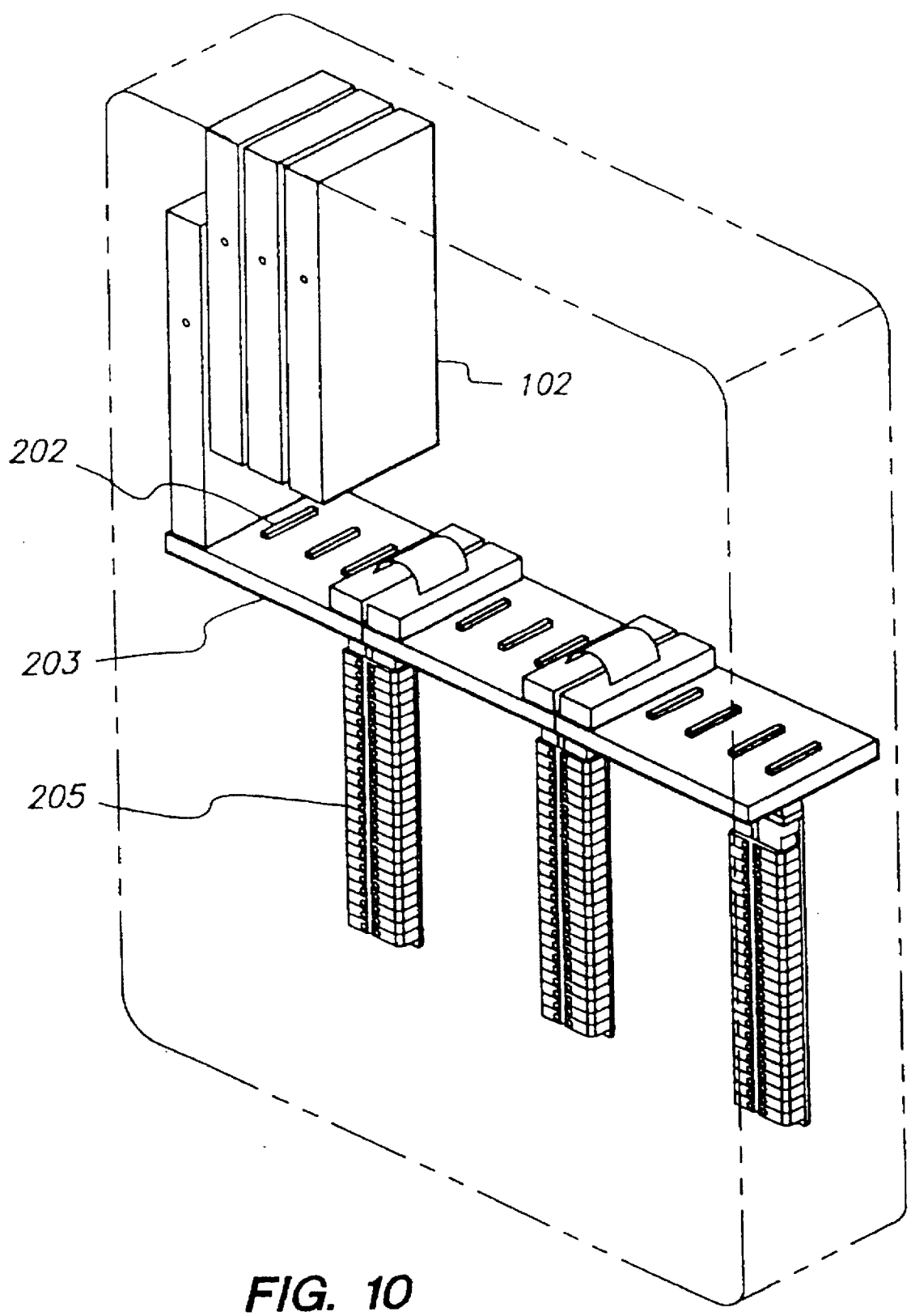
FIG. 10 illustrates several sealed active electronics modules assembled to several sealed back planes interconnected by sealed cable harnesses.

FIG. 10 illustrates the assembly of several modules 102 to a sealed back plane 203. Each back plane has several female connectors 204 electrically connected to a back plane circuit board and then potted to exclude moisture from the back side. Wires also connected to the backplane circuit board carry the signals to sealed terminal blocks 205. Once the modules 102 are plugged into the sealed female connectors 204 a totally sealed system is provided to protect the electronics. An additional advantage of individually sealing each active electronic circuit is greater reliability. If one leaks, the others are still unaffected. Also, humidity sensors can be included in each sealed electronics package 100. If any one of the units becomes moist an alarm is sounded and that unit can be replaced.

Figure 11:
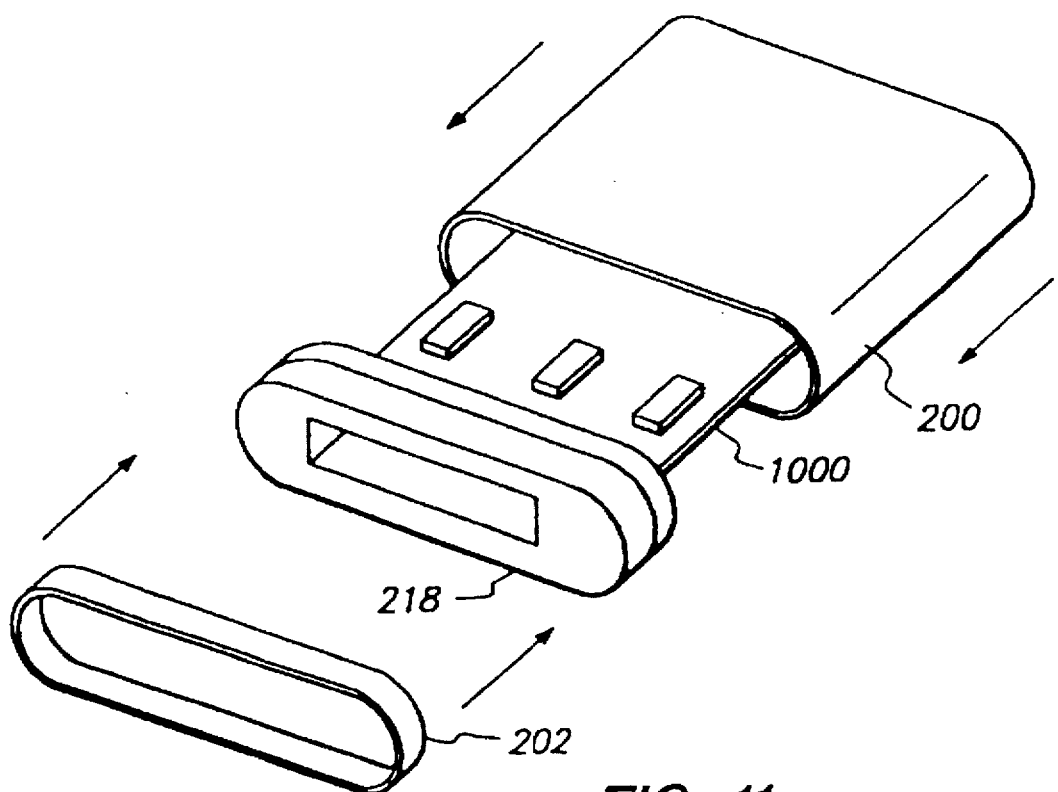
FIG. 11 illustrates a sealed active electronics module using a more crush resistant bag embodiment.

The protective box 101 has the disadvantage of reducing the heat transfer of the system and adding extra cost and bulk. In some cases, where only a moderate amount of mechanical protection is required, a more rigid sheet material 10 can be used, where the metal foil thickness is increased for greater bend resistance. FIG. 11 illustrates a closure of this type were the heavy sheet material 200 is heat sealed into a tubular shape that will just fit over the adapter 218. A hot melt bond between the adapter 218 and the sheet material 200 can be made or preferably a heat shrinkable band 202 with a hot melt adhesive on the inside is shrunk over the joint between the adapter 218 and the sheet 200. The back end can be closed by heat sealing and folding in the manner of a milk carton or by inserting a plug with a shape similar to the adapter 218 and sealing in a like manner.

Figure 13A:
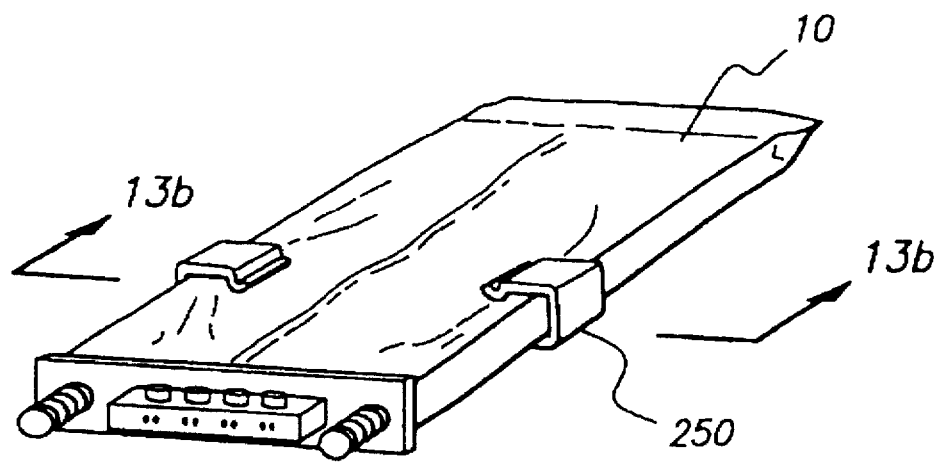
FIGS. 13a and 13b illustrates the parts shown in FIG. 12 after assembly and a cross section of the heat path.
Figure 13B:
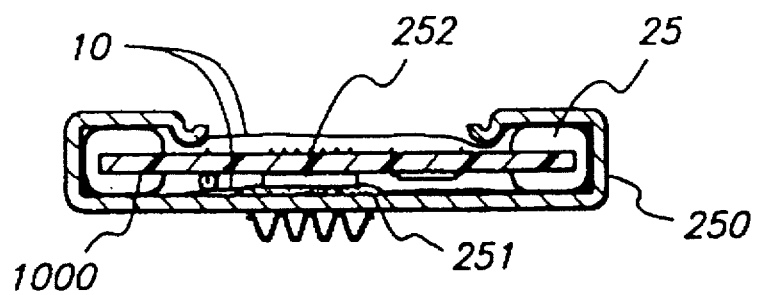
Figure 13C:
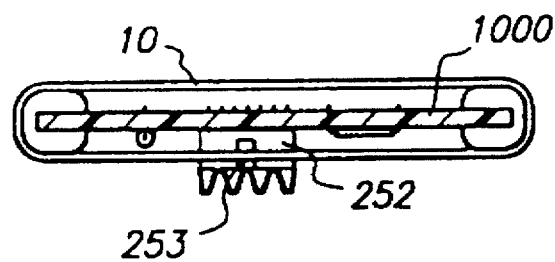
FIG. 13c illustrates an alternative embodiment to remove heat.

In some cases the heat produced by the active electronics 1000 will be quite high. The main impediment to the transfer of this heat out of the package is the insulating layer of air inside the sheet 10. The thermal resistance of the sheet 10 itself is quite low, since it is very thin and made largely of metal. FIG. 12 illustrates a means of thermally coupling a hot component on the active electronics 1000 board through the sheet 10 and into a heat spreader 250 in the free stream air. FIG. 13 illustrates the assembly of the parts in FIG. 12. After sealing the sheet 10 the heat spreader 250 is clamped on to the active electronics 1000 at the point where the stabilizer blocks 25 are attached. From section A—A in FIG. 13a and 13b it can be seen that the hot component 252 which is attached to the active electronics 1000 is pressed in contact with a thermally conductive gel pad 251 that has be preinstalled on the hot component 252 or inside the sheet material 10. A suitable thermally conductive gel 251 formulation for this purpose is described more thoroughly in U.S. Pat. No. 4,852,646, incorporated herein by reference. An additional pad of thermally conductive gel could also be applied between the outer surface of the sheet 10 and the heat spreader 250 to further improve the transfer of heat through the sheet 10 to the heat spreader. FIG. 13c shows an alternative approach to remove heat from hot component 252. A bolt, 253, penetrates the flexible laminate and connects directly to 252. A sealing material seals between the flexible laminate and the hot component.

Figure 14A:
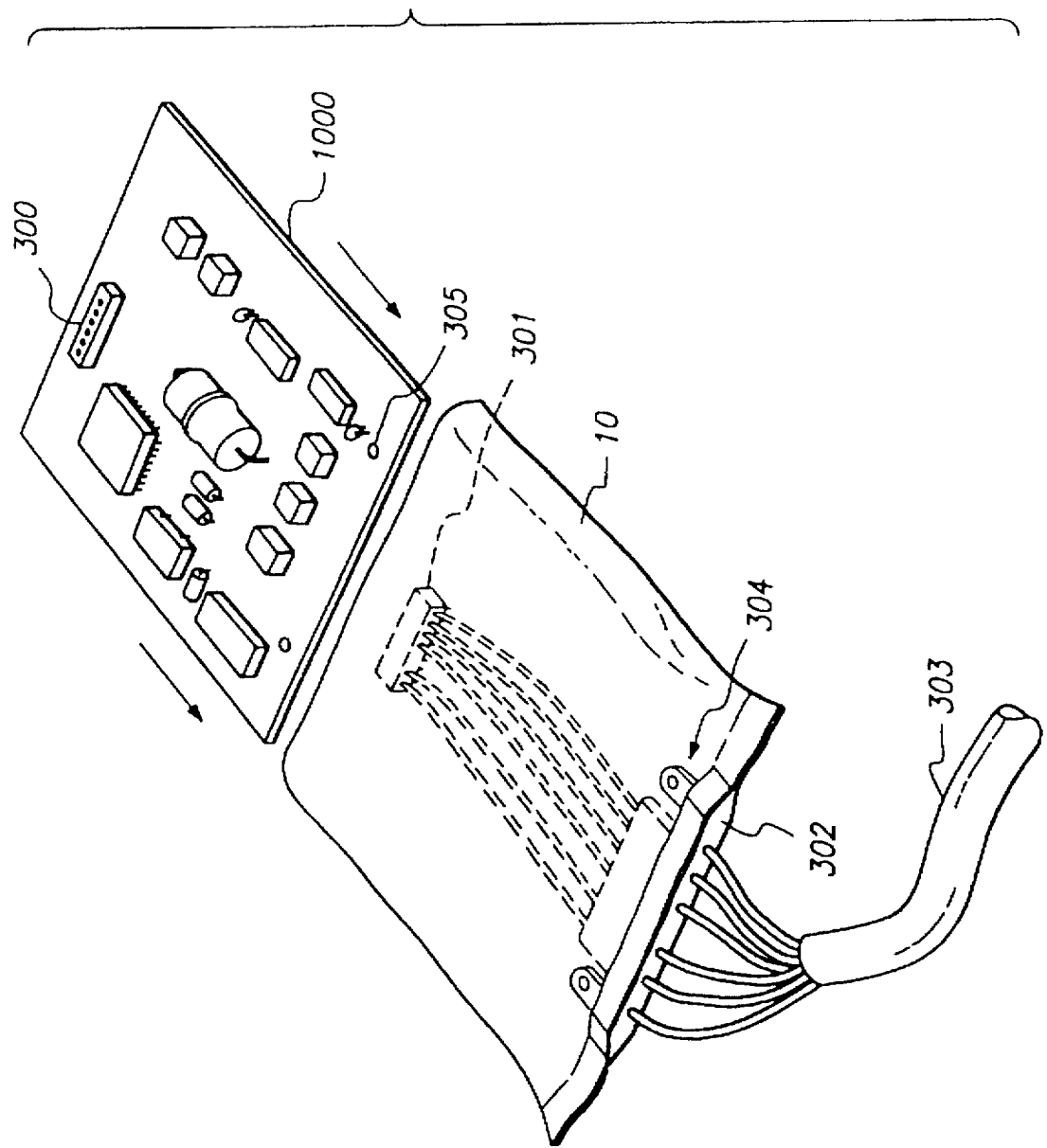

In some cases only a few fairly permanent connections from the active electronics 1000 are required. FIG. 14 illustrates a low cost method of providing packaging for this type of system. A connector 301 is attached to a wire harness 303 which is then insert molded into and adapter 302. To achieve a reliable seal it may be necessary to remove the insulation from the wire in the harness 303 in the area where it passes through the adapter 302 to block the flow of moisture under the insulation of the wires in harness 303. Alternatively a curing blocking material could be used or a blocked wire that is fabricated with a blocking agent between the wire and the insulation. To assemble the active electronics into the packaging 100 the active electronics 1000 is inserted into the open end of the packaging 100 until the latch features 304 molded onto the adapter 302 engage the holes 305 in the active electronics 1000. Once firmly attached in this manner, the connector 301 can be connected to the mating connector 300 on the active electronics 1000. After the desiccant/scavenger packet has been activated the open end of the sealed electronics packaging can be sealed as usual with a heat sealer. FIG. 14b illustrates another embodiment and potentially a lower cost method of sealing the electronics. A flat cable 306 is connected to connector 307. The flexible laminate barrier is installed over the circuit board 1000 and heatsealed with hot melt adhesive to the flat cable 306 and fused to itself on both sides of 306 to form a complete moisture vapor barrier around 1000.

Figure 15:
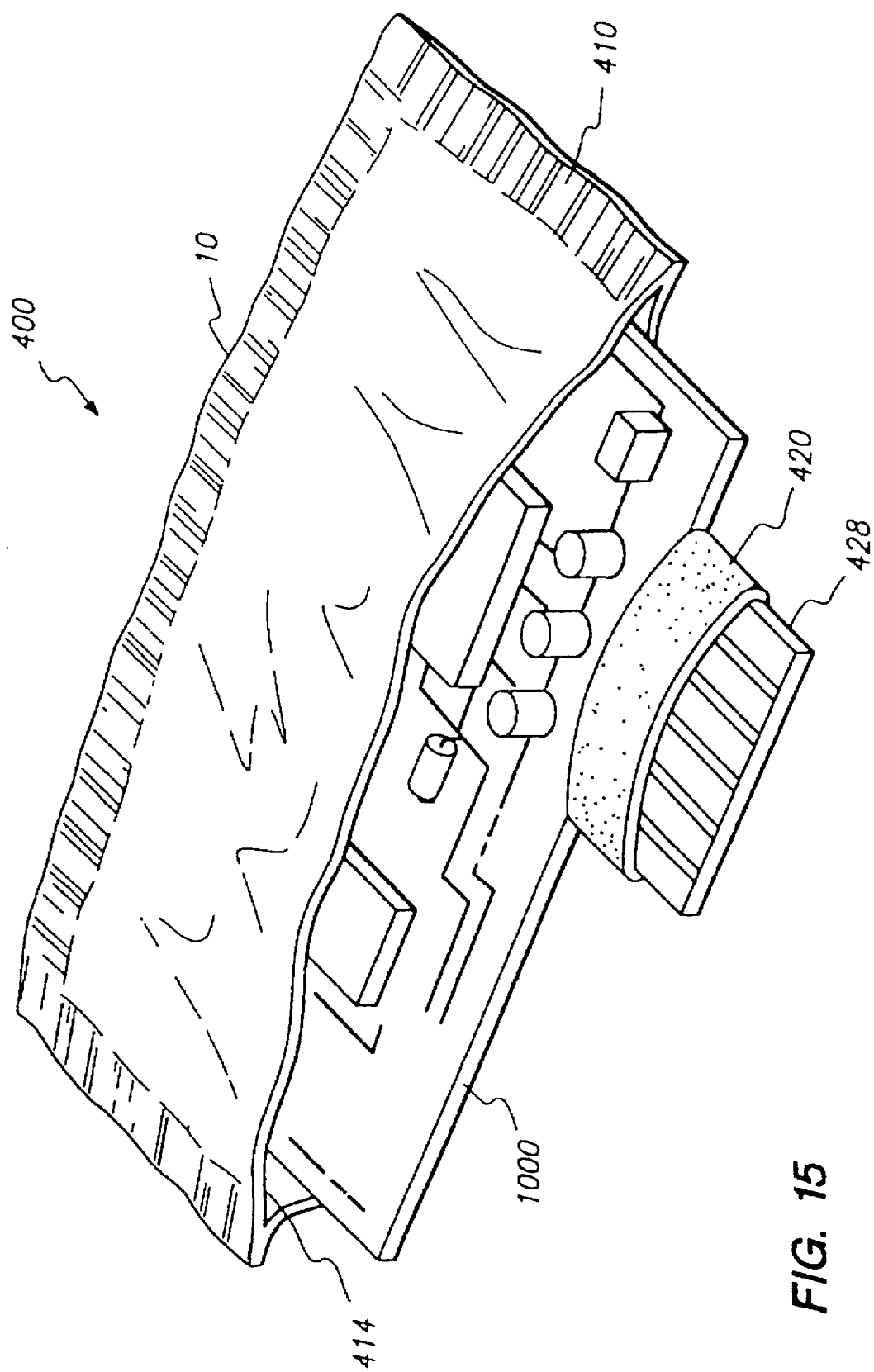
FIG. 15 illustrates an environmentally sealed bag embodiment in which the active electronics can be inserted with subsequent sealing using a card edge type connector.

In some cases it will be preferable to use a card edge type connector rather than a pin and socket type to interconnect the active electronics 1000 through the sealed electronics packaging 1000. FIG. 15 illustrates a simple method of accommodating this type of connector. A band of hot melt adhesive 420 is install around the card edge connector which as been fabricated to provide space for this application. Care must be take to assure that the contact fingers of the card edge connector 428 are not contaminated with this adhesive. Alternatively the adhesive could be insert molded on the card edge extension. The sheet material 10 is welded into a closure 410 with one open side 414. The active electronics 1000 are inserted into the closure 410 and the open edge 414 is heat sealed closed over the hot melt adhesive 420. A modified bag sealer with appropriate relief for the area near the card edge connector is required for this operation. Alternatively, a card edge adapter could be fabricated using a small paddle card and a female card edge connector. The adapter would be preassembled into the closure 410 with the side of the closure opposite the adapter left open. For final assembly the active electronics 1000 would be inserted into this open side and plugged into the female connector inside the closure. Then the open side could be heat sealed using conventional heat sealer. This alternative approach has the advantage of simplifying the heat sealing operation performed by final assembler.

FIGS. 16, 16a, and 16b illustrates another configuration of sealed electronics packaging for use with card edge connectors. An adapter 500 is sealed to the active electronics using and appropriate potting material 505. The closure 510 will seal to the adapter 500 which includes the active electronics board, at a U shaped member illustrated in FIGS. 16a and 16b with a pressure ring 520 which will be ultimately encased between the hard outer box 530 and base member 500 more specifically, 16b illustrates in partial cross section the process of inserting the active electronics board 1000 and sealing to the base member 500.

A further alternative is illustrated in FIG. 17. In this embodiment the adapter 618 is extended to from a complete ring around the active electronics 1000. The active electronics are plugged into the interior pins of the adapter connector 616 and then two sheets 10 are heat sealed or welded to the adapter ring 625. For additional strength a forming tool 620 can be used to form a secure lip 630 to hold the sheets 10 in place.

FIG. 18 shows an improved packaging system for use in underground applications when the electronics will be possibly submerged under water for long periods of time. A bell jar 700 is placed over the sealed electronic modules 702 and the backplane 701. The belljar keeps liquid water from 701 and 702.

The invention resides at least in part in the unexpected realization by the inventors that in spite of past thinking, the active electronics could be sealed in an appropriate laminate, protected from the environment, and still operate in harsh environments while permitting reentry to the package by splitting of the package 100 upon return to the factory. The invention has been described with respect to the previous particularly preferred embodiment. Modifications obvious to the ordinary skilled artisan are intended to be within the scope of the invention. For example, the aluminum metallic sheet might be copper silver gold or other suitable material. The plastic laminate could be a one sheet fused to the metallic layer and folded over and fused to itself. The bag itself might have a sealed entry port in the event that the bag was not to be discarded upon requiring access to the active electronics to make repairs, and the like.

What is claimed is:

1. A protection apparatus for an active electronics circuit board comprising:

a flexible environmental gas and liquid barrier envelope capable of accepting the active electronics circuit board, said envelope completely sealed around the entire said active electronics circuit board; and an interconnection device sealed to said envelope which contains the active electronics circuit board and also permitting the connection of the active electronics circuit board into an electronics system outside said sealed envelope; and wherein the interior of the envelope contains an infra red radiation absorbing black coating.

2. The apparatus according to claim 1 wherein the flexible envelope comprises at least two plastic layers and a central metal layer wherein the outermost plastic layers are about between 75 to about 200 microns, the interior plastic layers are from about 20 to 200 microns and the central metallic layer is from about 5 to 75 microns.

3. The apparatus according to claim 1 wherein the envelope comprises a sandwich construction of a layer of tear resistant plastic, on opposite sides of a metallic gas liquid barrier; and wherein the layer comprises top and bottom layers of a flexible plastic of about 80 microns thick of polyethylene and interior layers about 200 microns thick of a polyamide or polyester and a central metal layer about 20 microns thick.

4. The apparatus according to claim 3 wherein the metal is selected from the group consisting of aluminum, tin, alloys including aluminum, alloys including tin, and mixtures thereof.

5. A protection apparatus for an electronic circuit board comprising:

a flexible environmental gas and liquid barrier envelope capable of accepting the active electronics circuit board, said envelope completely sealed around said active electronics circuit board; and an interconnection device sealed to said envelope which contains the active electronic printed circuit board and also permitting the connection of the active electronics circuit board into an electronics system; and wherein the flexible envelope comprises at least two plastic layers and a central metal layer wherein the outermost plastic layers are about between 75 to about 200 microns, the interior plastic layers are from about 20 to 200 microns and the central metallic layer is from about 5 to 75 microns.

6. The apparatus according to claim 5 wherein the outer plastic is a low density polyethylene and the interior layer is selected from the group consisting of a polyamide or a polyester and the central metallic layer is selected from the group consisting of aluminum or alloys thereof.

7. The apparatus according to claim 6 further including a portion of the envelope not including the metallic layer so as to provide a visible window into the interior of the envelope.

8. The apparatus according to claim 7 wherein a transparent tin oxide or indium tin oxide layer is disposed between plastic layers to provide visible access to the board while maintaining a gas and liquid barrier.

9. The apparatus according to claim 7 wherein said interconnection device of said protection apparatus is at least partially filled with a gel sealant to provide for sealing of electrical contacts into the active electronics circuit board.

10. The apparatus according to claim 9 further including a gas scavenger/desiccant package within the interior of the envelope.

11. The apparatus according to claim 9 wherein the envelope is sized to provide slack volume over the range of desired operating conditions.

12. The apparatus according to claim 11 wherein the interconnection device and the portion of the envelope contacting the interconnection device are fabricated from fusion bondable materials.

\* \* \* \* \*